US012142605B2

(12) United States Patent
Nishi et al.

(10) Patent No.: US 12,142,605 B2
(45) Date of Patent: Nov. 12, 2024

(54) SEMICONDUCTOR DEVICE AND METHOD FOR MANUFACTURING THE SAME

(71) Applicant: Mitsubishi Electric Corporation, Tokyo (JP)

(72) Inventors: Koichi Nishi, Tokyo (JP); Shinya Soneda, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 398 days.

(21) Appl. No.: 17/660,324

(22) Filed: Apr. 22, 2022

(65) Prior Publication Data

US 2023/0027990 A1    Jan. 26, 2023

(30) Foreign Application Priority Data

Jul. 26, 2021    (JP) ................. 2021-121367

(51) Int. Cl.
| | |
|---|---|
| H01L 27/06 | (2006.01) |
| H01L 23/482 | (2006.01) |
| H01L 29/739 | (2006.01) |
| H01L 49/02 | (2006.01) |

(52) U.S. Cl.
CPC ...... *H01L 27/0658* (2013.01); *H01L 23/4824* (2013.01); *H01L 28/20* (2013.01); *H01L 29/7397* (2013.01)

(58) Field of Classification Search
None
See application file for complete search history.

(56) References Cited

U.S. PATENT DOCUMENTS

| | | | |
|---|---|---|---|
| 10,931,276 B1* | 2/2021 | Suh | H01L 29/7397 |
| 2007/0040236 A1* | 2/2007 | Nowak | H01L 29/8605 |
| | | | 257/E27.047 |
| 2008/0290407 A1 | 11/2008 | Kusunoki et al. | |
| 2010/0163922 A1* | 7/2010 | Yoneda | H01L 27/0652 |
| | | | 257/140 |

(Continued)

FOREIGN PATENT DOCUMENTS

| | | | | |
|---|---|---|---|---|
| JP | 2003133557 A | * | 5/2003 | ......... H01L 27/0629 |
| JP | 2004-281918 A | | 10/2004 | |

(Continued)

OTHER PUBLICATIONS

An Office Action; "Notice of Reasons for Refusal," mailed by the Japanese Patent Office on May 14, 2024, which corresponds to Japanese Patent Application No. 2021-121367 and is related to U.S. Appl. No. 17/660,324; with English language translation.

*Primary Examiner* — Scott B Geyer
(74) *Attorney, Agent, or Firm* — Studebaker & Brackett PC

(57) ABSTRACT

All of four of built-in gate resistance trenches function as practical built-in gate resistance trenches. A first end portion of each of four of the built-in gate resistance trenches is electrically connected to a wiring side contact region of a gate wiring via a wiring contact. A second end portion of each of four of the built-in gate resistance trenches is electrically connected to a pad side contact region of a gate pad via a pad contact. In each of four of the built-in gate resistance trenches, a distance between the wiring contact and the pad contact is defined as an inter-contact distance.

14 Claims, 15 Drawing Sheets

(56) References Cited

U.S. PATENT DOCUMENTS

| | | | |
|---|---|---|---|
| 2016/0379992 A1* | 12/2016 | Nagao | H01L 29/7803 |
| | | | 257/77 |
| 2018/0226399 A1* | 8/2018 | Tamaki | H01L 29/0834 |
| 2019/0115217 A1 | 4/2019 | Takaki et al. | |
| 2019/0326277 A1* | 10/2019 | Feil | H01L 29/4236 |
| 2020/0091339 A1* | 3/2020 | Okumura | H01L 29/4236 |
| 2020/0185500 A1* | 6/2020 | Nagata | H01L 29/7395 |
| 2020/0294989 A1* | 9/2020 | Okumura | H01L 29/7811 |
| 2021/0082912 A1* | 3/2021 | Shirakawa | H01L 29/4236 |
| 2021/0151429 A1* | 5/2021 | Obata | H01L 29/4238 |
| 2023/0062583 A1* | 3/2023 | Ueda | H01L 23/5228 |
| 2023/0155013 A1* | 5/2023 | Nagata | H01L 29/0619 |
| | | | 257/140 |

FOREIGN PATENT DOCUMENTS

| | | | | |
|---|---|---|---|---|
| JP | 2008-294301 A | | 12/2008 | |
| JP | 2013062523 A | * | 4/2013 | H01L 27/0611 |
| JP | 2014150275 A | * | 8/2014 | H01L 27/0611 |
| JP | 2017-011007 A | | 1/2017 | |
| WO | 2018/008068 A1 | | 1/2018 | |

\* cited by examiner

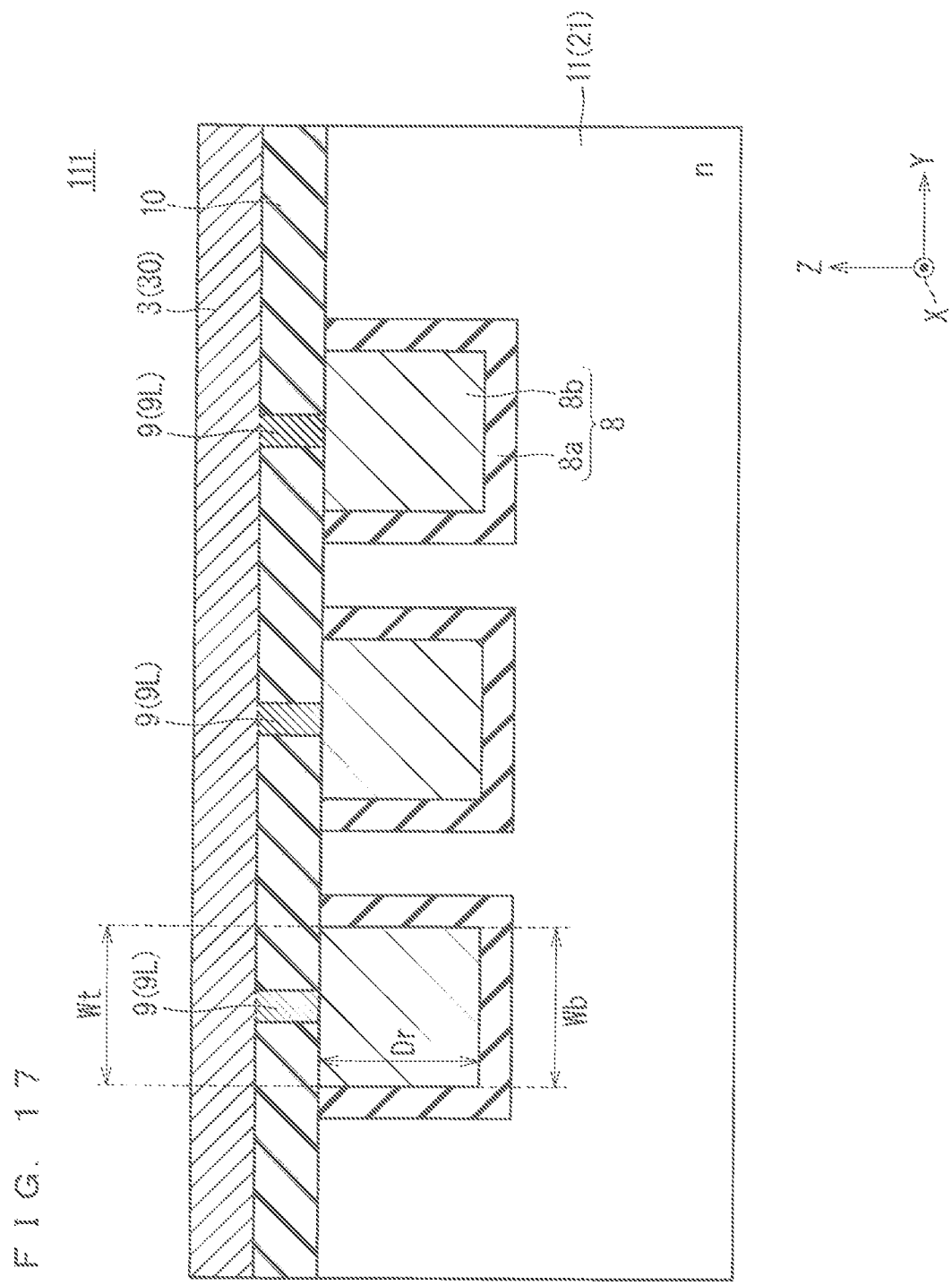

SEMICONDUCTOR DEVICE AND METHOD FOR MANUFACTURING THE SAME

BACKGROUND OF THE INVENTION

Field of the Invention

The present disclosure relates to a semiconductor device having a switching element having an insulated gate structure, and more particularly to a semiconductor device in which a built-in gate resistance value for a gate electrode of a switching element is easily adjusted, and a method for manufacturing the semiconductor device.

Description of the Background Art

In recent years, switching elements having an insulated gate structure such as an IGBT and a MOSFET have been employed as power semiconductor elements. In order to control a switching speed of the switching element, a resistance element integrated on a chip may be used as a built-in gate resistor for a gate electrode of the switching element.

For example, Japanese Patent Application Laid-Open No. 2013-062523 proposes a structure in which a trench type built-in gate resistor is formed as a built-in gate resistor for a gate electrode to reduce an area of the built-in gate resistor in plan view while suppressing gate current density.

However, in the conventional structure disclosed in Japanese Patent Application Laid-Open No. 2013-062523 and the like, a trench type built-in gate resistor and a gate electrode of a switching element formed in a cell portion are generally connected by polysilicon wiring. Note that the gate electrode has a trench gate structure.

For this reason, there has been a problem that it is necessary to change a plurality of patterns such as a trench, a polysilicon wiring, and a contact in order to control a resistance value of a gate electrode, and it is not easy to adjust the resistance value. This is because it is necessary to prepare a plurality of masks corresponding to a plurality of patterns. Note that a trench type built-in gate resistor and a trench gate of a switching element correspond to the trench.

Furthermore, in a conventional structure, since a thermal oxide film having a relatively large film thickness is provided around a built-in gate resistance region, there has also been a problem that stress is likely to be applied to the built-in gate resistance region. Note that the thermal oxide film is used as a field oxide film or a LOCOS.

SUMMARY

An object is to obtain a semiconductor device having a built-in gate resistance region electrically connected to a gate electrode of a switching element and for which a resistance value can be easily adjusted.

In a semiconductor device including a switching element having an insulated gate structure, the switching element is provided in a semiconductor substrate of a first conductivity type.

The semiconductor device includes a gate wiring, a gate pad, and a built-in gate resistance region.

The gate wiring is provided in the semiconductor substrate with an interlayer insulating film interposed between them, and is electrically connected to a gate electrode of the switching element.

The gate pad is provided on the semiconductor substrate with the interlayer insulating film interposed between them, and has an electrical connection region whose surface is exposed.

The built-in gate resistance region electrically connects the gate wiring and the gate pad.

The built-in gate resistance region includes N (N≥2) partial built-in gate resistance regions connected in parallel between the gate wiring and the gate pad.

Each of the N partial built-in gate resistance regions includes M (M≥2) built-in gate resistance trenches connected in parallel between the gate wiring and the gate pad.

The gate wiring has a wiring side contact region overlapping the M built-in gate resistance trenches in plan view.

The gate pad has a pad side contact region overlapping the M built-in gate resistance trenches in plan view.

Each of the M built-in gate resistance trenches is embedded in the semiconductor substrate, and K (M≥K≥2) of the M built-in gate resistance trenches function as practical built-in gate resistance trenches.

Each of the K practical built-in gate resistance trenches is electrically connected to the wiring side contact region of the gate wiring via a wiring contact provided penetrating the interlayer insulating film, and is electrically connected to the pad side contact region of the gate pad via a pad contact provided penetrating the interlayer insulating film.

In each of the K practical built-in gate resistance trenches, a gate current path is provided between the wiring contact and the pad contact, and a distance between the wiring contact and the pad contact in the gate current path is defined as an inter-contact distance.

In the semiconductor device of the present disclosure, a resistance value of the gate current path of each of the K practical built-in gate resistance trenches can be adjusted by the inter-contact distance. Furthermore, a resistance value of each of the N partial built-in gate resistance regions can be adjusted by adjusting the number K of practical built-in gate resistance trenches.

As a result, in the semiconductor device of the present disclosure, a resistance value of the built-in gate resistance region including the N partial built-in gate resistance regions can be relatively easily adjusted at the time of manufacturing based on the inter-contact distance and the number K of practical built-in gate resistance trenches.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 17 is a cross-sectional view illustrating a cross-sectional structure taken along line B-B in FIG. 6 in an eleventh preferred embodiment.

DESCRIPTION OF THE PREFERRED EMBODIMENTS

First Preferred Embodiment

Figure 1:
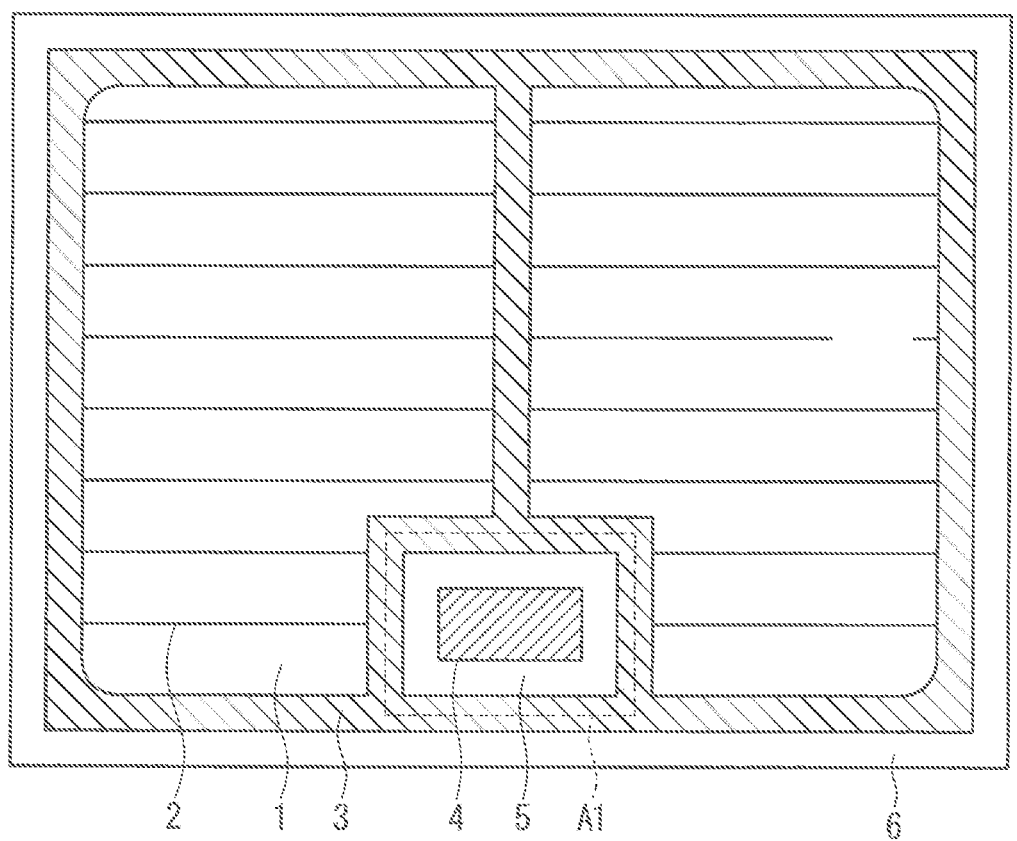
FIG. 1 is an explanatory view schematically illustrating a planar structure of a first aspect in a semiconductor device of a first preferred embodiment.
Figure 2:
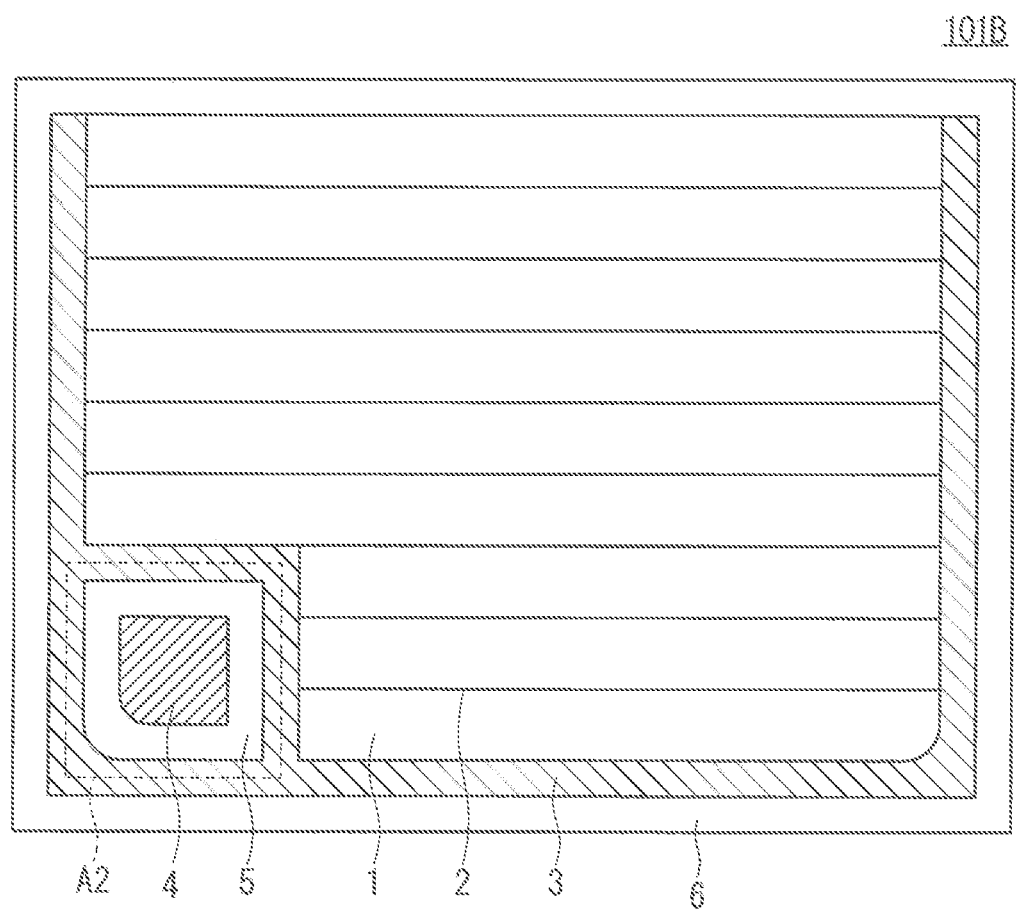
FIG. 2 is an explanatory view schematically illustrating a planar structure of a second aspect of the first preferred embodiment.
Figure 3:
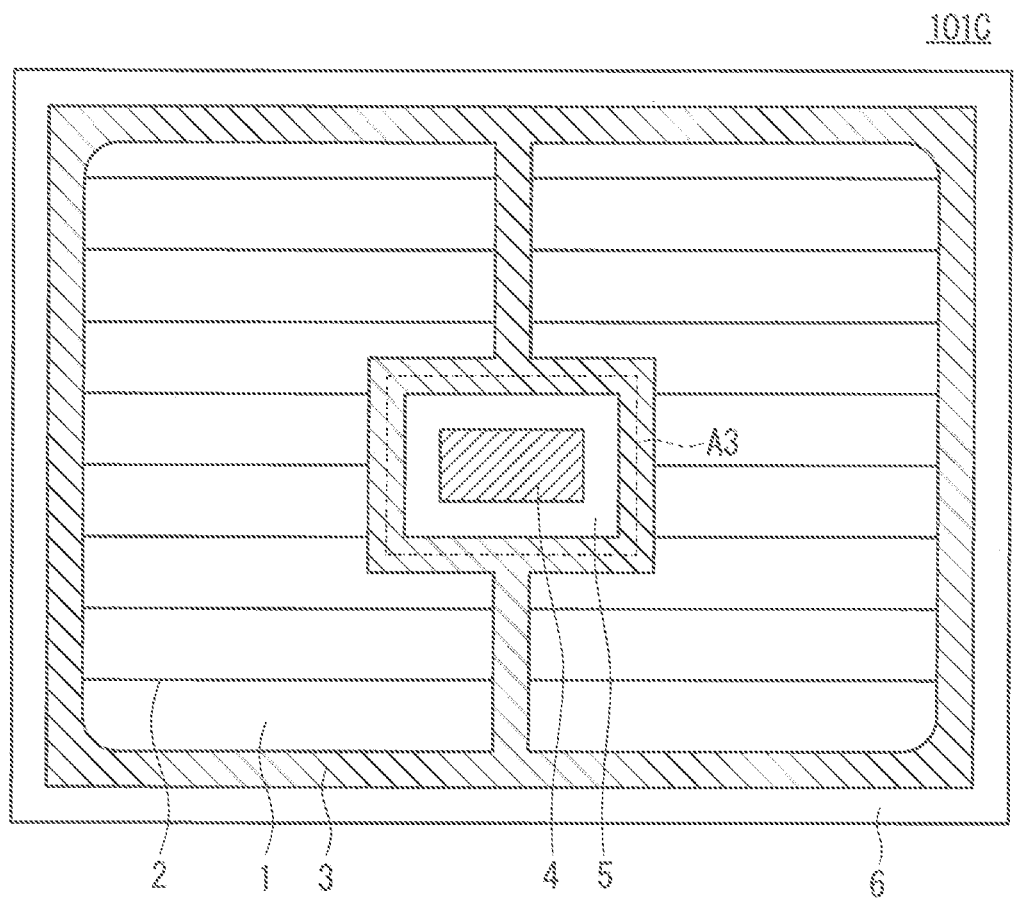
FIG. 3 is an explanatory view schematically illustrating a planar structure of a third aspect of the first preferred embodiment.

FIGS. 1 to 3 are explanatory views schematically illustrating a planar structure of a semiconductor device according to a first preferred embodiment of the present disclosure. A semiconductor device 101A illustrated in FIG. 1 is a first aspect of the first preferred embodiment, a semiconductor device 101B illustrated in FIG. 2 is a second aspect of the first preferred embodiment, and a semiconductor device 101C illustrated in FIG. 3 is a third aspect of the first preferred embodiment. Hereinafter, there are a case where the semiconductor devices 101A to 101C are collectively referred to, and a case where the semiconductor devices 101A to 101C are simply referred to as the "semiconductor device 101".

As illustrated in these diagrams, the semiconductor device 101 includes a cell region 1, a gate wiring 3, a gate pad 4, a built-in gate resistance region 5, and a termination region 6 as main constituent elements.

The cell region 1 has a rectangular shape with rounded corners in plan view except for a part of a cell missing region. The semiconductor device 101 includes an IGBT as a switching element having an insulated gate structure in the cell region 1.

In the semiconductor device 101A according to the first aspect illustrated in FIG. 1, in a cell missing region where the cell region 1 is not formed, the gate wiring 3 that is laid across the cell region 1 from the upper side to the center in the diagram and a gate pad peripheral region A1 are provided. The gate pad peripheral region A1 is arranged in a lower central portion of the cell region 1.

In the semiconductor device 101B in the second aspect illustrated in FIG. 2, a gate pad peripheral region A2 is provided in a cell missing region. The gate pad peripheral region A2 is arranged at the lower left in the diagram. In the semiconductor device 101C in the third aspect illustrated in FIG. 3, the gate wiring 3 that is laid across the upper center and the lower center and a gate pad peripheral region A3 are provided in a cell missing region. The gate pad peripheral region A3 is arranged at the center in the diagram.

In each of the gate pad peripheral regions A1 to A3, the gate pad 4 is provided at the center in plan view, the built-in gate resistance region 5 is provided surrounding the outer periphery of the gate pad 4 in plan view, and the gate wiring 3 is provided surrounding the outer periphery of the built-in gate resistance region 5 in plan view.

An IGBT 50 (not illustrated in FIGS. 1 to 3) is provided in the cell region 1 of the semiconductor device 101, and a trench gate 2 which is a gate electrode of the IGBT 50 is provided in the cell region 1 so as to extend in the lateral direction in the diagram.

The gate wiring 3 is also provided in an outer peripheral region of the cell region 1, and is electrically connected to the trench gate 2.

The gate pad 4 has an electrical connection region whose surface is exposed. In this electrical connection region, electrical connection with the outside can be achieved. As described above, the built-in gate resistance region 5 is provided surrounding the periphery of the gate pad 4, and the gate wiring 3 is provided surrounding the built-in gate resistance region 5.

The gate wiring 3 and the gate pad 4 are electrically connected via the built-in gate resistance region 5. Furthermore, the termination region 6 is provided surrounding a peripheral region of the gate wiring 3.

The gate wiring 3 may be provided on the entire periphery of the cell region 1 as in the semiconductor device 101A or the semiconductor device 101C, or may be provided in a part of the outer periphery of the cell region 1 as in the semiconductor device 101B. In the semiconductor device 101B, the gate wiring 3 is not provided in a peripheral region on the upper side of the cell region 1 in the diagram.

Further, as in the semiconductor device 101A and the semiconductor device 101C, the gate wiring 3 may be provided so as to be laid across the center of the cell region 1 in the diagram.

The gate pad 4 may be arranged at the lower center of the cell region 1 in the diagram as in the semiconductor device 101A, may be arranged in a central portion of the cell region 1 in the diagram as in the semiconductor device 101C, or may be arranged in a corner portion at the lower left of the cell region 1 in the diagram as in the semiconductor device 101B.

Figure 4:
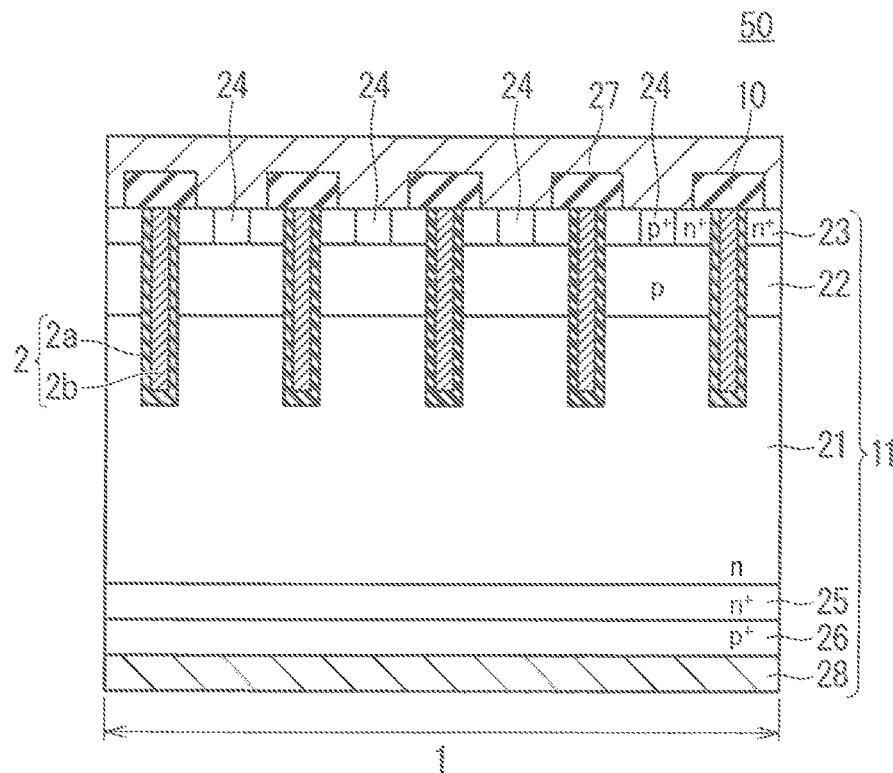
FIG. 4 is a cross-sectional view illustrating a cross-sectional structure of an IGBT provided in a cell region illustrated in FIGS. 1 to 3.

FIG. 4 is a cross-sectional view illustrating a cross-sectional structure of the IGBT 50 provided in the cell region 1.

As illustrated in FIG. 4, a semiconductor substrate 11 includes a range from a drift layer 21 including a base layer 22 to a collector layer 26 from the top to the bottom. Note that the base layer 22 includes an emitter layer 23 and a contact layer 24 formed on an upper layer.

In FIG. 4, an upper end of the drift layer 21 including the base layer 22 in the diagram is referred to as a first main surface of the semiconductor substrate 11, and a lower end of the collector layer 26 in the diagram is referred to as a second main surface of the semiconductor substrate 11. The first main surface of the semiconductor substrate 11 is a main surface on the front surface side of the semiconductor device 101, and the second main surface of the semiconductor substrate 11 is a main surface on the back surface side of the semiconductor device 101.

As described above, the semiconductor substrate 11 includes the drift layer 21, a buffer layer 25, and the collector layer 26.

The buffer layer 25 is provided adjacent to the second main surface side of the n-type drift layer 21 of a first conductivity type. The buffer layer 25 shows an $n^+$ type in which an impurity concentration of an n type is higher than that of the drift layer 21.

The collector layer 26 is provided adjacent to the second main surface side of the buffer layer 25. The collector layer 26 shows a $p^+$ type in which an impurity concentration of a p type which is a second conductivity type is relatively high. A collector electrode 28 is provided on a second main surface of the collector layer 26.

The base layer 22 is provided on the first main surface side in the drift layer 21. The base layer 22 shows a p type which is the second conductivity type.

A plurality of the trench gates 2 penetrating the emitter layer 23 and the base layer 22 from the first main surface of the semiconductor substrate 11 and reaching the drift layer 21 are formed. A plurality of the trench gates 2 are provided with an embedded gate electrode 2b serving as an embedded gate electrode via a gate insulating film 2a serving as a gate trench insulating film.

A plurality of the $n^+$-type emitter layers 23 are provided on the first main surface side in the base layer 22. Each of a plurality of the emitter layers 23 is provided adjacent to a corresponding one of a plurality of the trench gates 2.

The $p^+$-type contact layer 24 is provided on the first main surface side in the base layer 22 between the embedded gate electrodes 2b and 2b adjacent to each other. The contact layer 24 is provided so as to be in contact with each of a pair of the emitter layers 23 present on both sides. Note that the emitter layer 23 and the contact layer 24 may be alternately formed along an extending direction of the trench gate 2.

Furthermore, an interlayer insulating film 10 is provided on the first main surfaces of a plurality of the trench gates 2.

An emitter electrode 27 is provided in the entire region on the first main surface of the semiconductor substrate 11 via the interlayer insulating film 10. Therefore, the emitter electrode 27 is electrically connected to the emitter layer 23 and the contact layer 24.

The IGBT 50 includes the trench gate 2, the drift layer 21, the base layer 22, the emitter layer 23, the contact layer 24, the buffer layer 25, the collector layer 26, the emitter electrode 27, and the collector electrode 28 as main constituent elements. In the structure illustrated in FIG. 4, the IGBT 50 is an n-channel type IGBT and is a switching element having an insulated gate structure.

Note that the trench gate 2 illustrated in FIGS. 1 to 3 means the embedded gate electrode 2b to be accurate.

Figure 5:
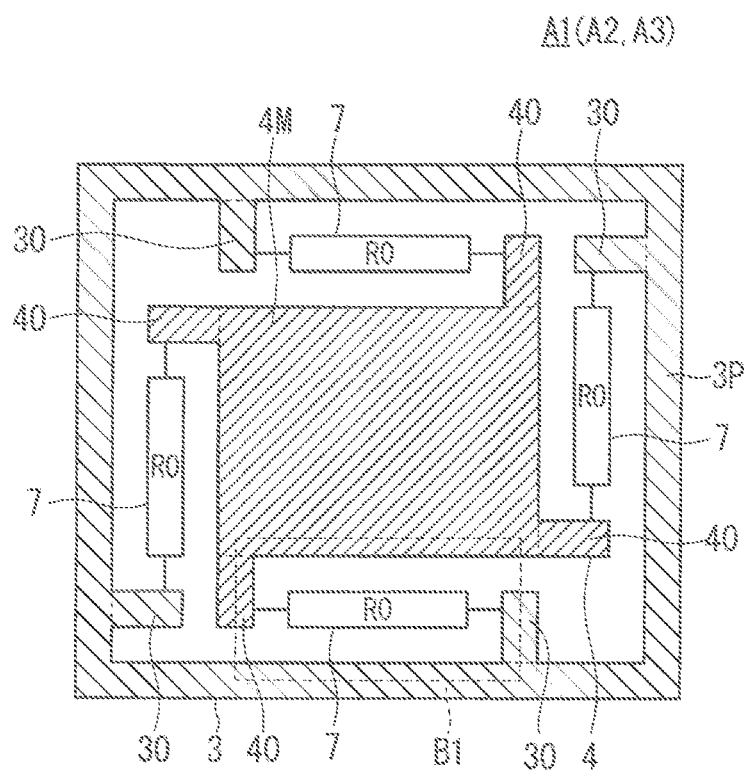
FIG. 5 is an explanatory view schematically illustrating a detailed structure of a gate pad peripheral region illustrated in FIG. 1.

FIG. 5 is an explanatory diagram schematically illustrating a detailed structure of the gate pad peripheral region A1. Note that a detailed structure of each of the gate pad peripheral regions A2 and A3 is similar to that of the gate pad peripheral region A1. Hereinafter, the gate pad peripheral region A1 will be described as a representative.

As illustrated in the diagram, the gate pad 4 includes a pad main region 4M provided at the center and four pad side contact regions 40 provided to extend in a direction from the pad main region 4M toward the gate wiring 3.

The pad main region 4M has a rectangular shape in plan view and is an electrical connection region whose surface is exposed, and electrical connection to the outside can be made in the pad main region 4M.

As illustrated in the diagram, the gate wiring 3 includes an outer peripheral wiring region 3P provided along the outer periphery of the gate pad 4 and four wiring side contact regions 30 provided to extend in a direction from the outer peripheral wiring region 3P toward the gate pad 4. Four of the wiring side contact regions 30 and four of the pad side contact regions 40 have a one-to-one correspondence.

Among four of the wiring side contact regions 30 and four of the pad side contact regions 40, a built-in gate resistance unit 7 is provided between the corresponding wiring side contact region 30 and pad side contact region 40. Therefore, four of the built-in gate resistance units 7 are provided in one-to-one correspondence with four of the wiring side contact regions 30 and four of the pad side contact regions 40. The corresponding wiring side contact region 30 and pad side contact region 40 are electrically connected by the built-in gate resistance unit 7.

Four of the built-in gate resistance units 7 function as N (N≥2) partial built-in gate resistance regions, are provided to face four sides of the pad main region 4M in plan view, and are classified into first to fourth partial built-in gate resistance regions. In the first preferred embodiment, {N=4} is established.

In the first preferred embodiment, four of the built-in gate resistance units 7 have the same resistance values R0. Note that a resistance value of a part of four of the built-in gate resistance units 7 may be set to a different value.

Figure 6:
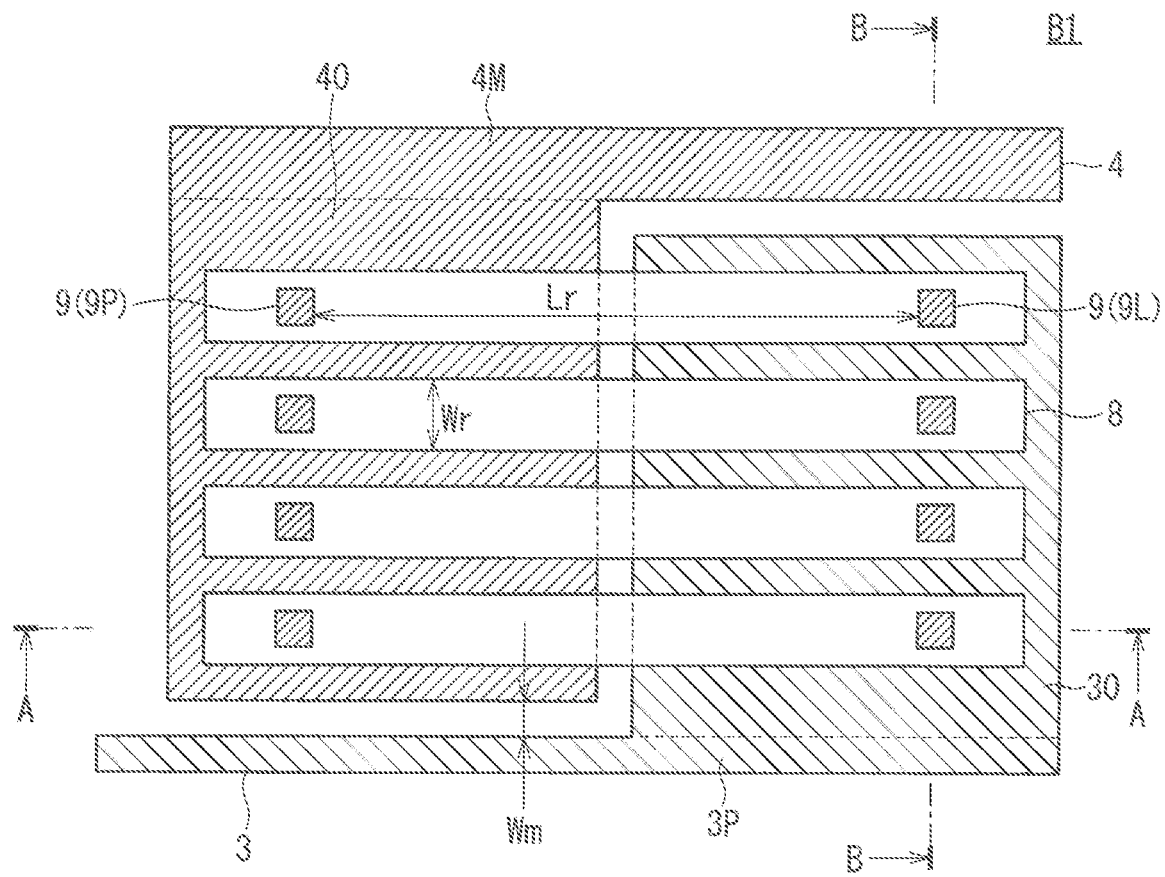
FIG. 6 is an enlarged plan view illustrating a built-in gate resistance peripheral region in FIG. 5.
Figure 7:
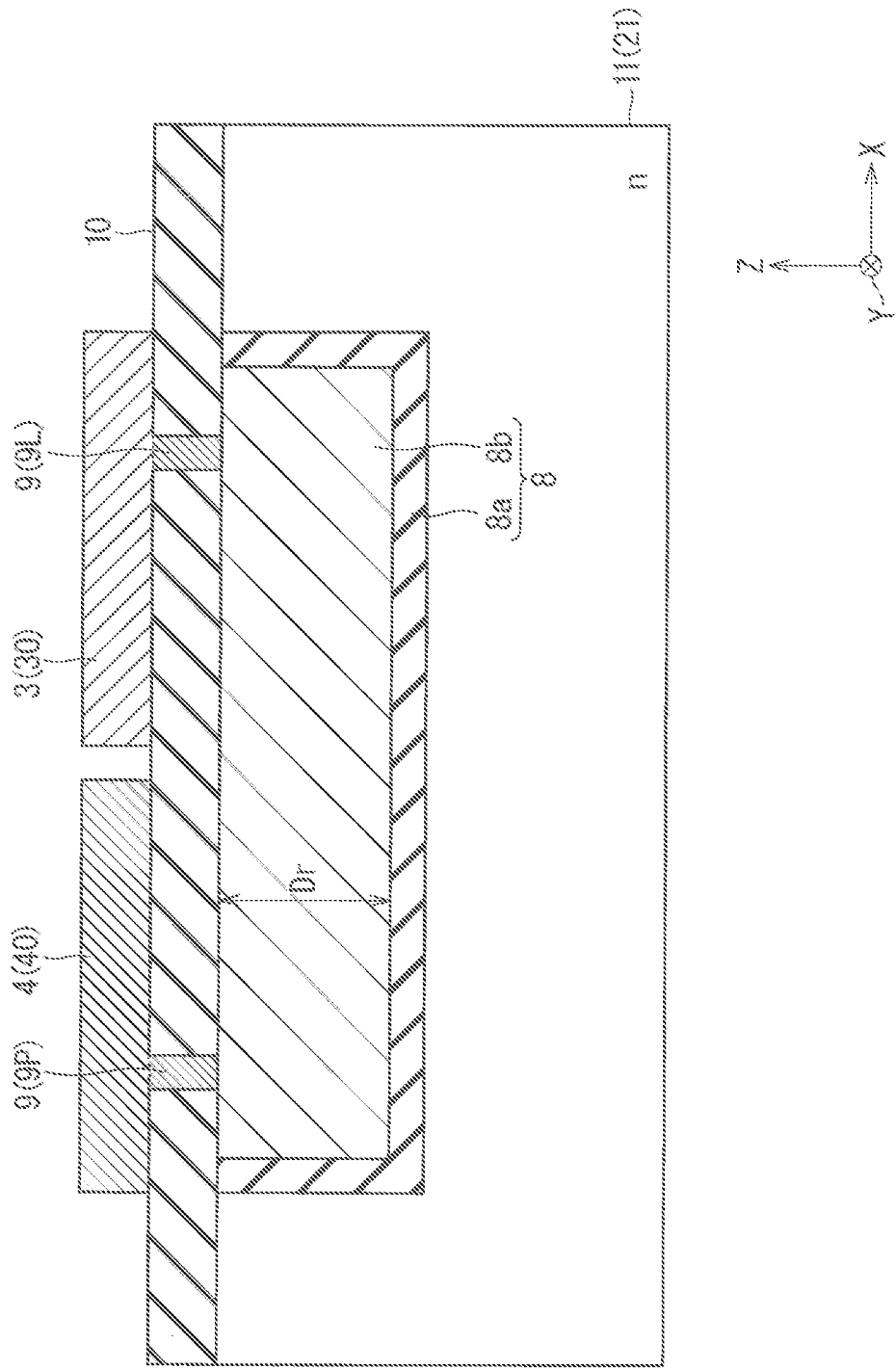
FIG. 7 is a cross-sectional view illustrating a cross-sectional structure taken along line A-A in FIG. 6.

FIG. 6 is an enlarged plan view illustrating a built-in gate resistance peripheral region B1 in FIG. 5. FIG. 7 is a cross-sectional view illustrating a cross-sectional structure taken along line A-A in FIG. 6. An XYZ orthogonal coordinate system is illustrated in each of FIGS. 6 and 7.

As illustrated in these diagrams, in the gate pad 4, the pad side contact region 40 is provided extending in a −Y direction from the pad main region 4M, and in the gate wiring 3, the wiring side contact region 30 is provided extending in a +Y direction from the outer peripheral wiring region 3P. The pad side contact region 40 and the wiring side contact region 30 are provided without overlapping each other in plan view.

In the semiconductor device 101 of the first preferred embodiment, since the wiring side contact region 30 is provided outside the outer peripheral wiring region 3P and the pad side contact region 40 is provided outside the pad main region 4M, an inter-pad wiring distance Wm between the gate wiring 3 and the gate pad 4 is relatively short.

Four built-in gate resistance trenches 8 are provided from the pad side contact region 40 to the wiring side contact region 30 in plan view. Each of four of the built-in gate resistance trenches 8 has a rectangular shape in plan view, and has a long side extending in an X direction and a short side extending in a Y direction.

As illustrated in FIG. 6, four of the built-in gate resistance trenches 8 have the same shape, and each of the built-in gate resistance trenches 8 has a constant resistance trench width Wr in a short-side direction. A part of four of the built-in gate resistance trenches 8 overlaps the pad side contact region 40 in plan view, and the other part overlaps the wiring side contact region 30 in plan view.

As described above, the gate wiring 3 has the wiring side contact region 30 overlapping M (M≥2) of the built-in gate resistance trenches 8 in plan view, and the gate pad 4 has the pad side contact region 40 overlapping M of the built-in gate resistance trenches 8 in plan view. In the example illustrated in FIG. 6, {M=4} is established.

As illustrated in FIG. 7, the built-in gate resistance trench 8 is embedded in the n-type semiconductor substrate 11 of the first conductivity type, and includes a trench insulating film 8a and a trench electrode 8b as main constituent elements. For convenience of description, only a region corresponding to the drift layer 21 illustrated in FIG. 4 is illustrated as the semiconductor substrate 11 illustrated in FIG. 7.

Note that parameters such as the resistance trench width Wr and an inter-contact distance Lr regarding the built-in gate resistance trench 8 are parameters regarding the trench electrode 8b serving as a resistance component to be accurate. Specifically, the resistance trench width Wr is a formation width of the trench electrode 8b to be accurate, and the inter-contact distance Lr is a distance between a pad contact 9P and a wiring contact 9L in the trench electrode 8b to be accurate.

The trench electrode 8b has a resistance trench depth Dr, and the trench insulating film 8a is provided so as to cover the entire periphery of the trench electrode 8b. Therefore, the trench electrode 8b does not have an electrical connection relationship with the semiconductor substrate 11.

The electrical connection of the built-in gate resistance trench 8 is made by the trench electrode 8b serving as a resistance component in the built-in gate resistance trench 8 to be accurate. In the present description, for convenience of explanation, there is a case where the electrical connection is described as "electrical connection of the built-in gate resistance trench 8".

As illustrated in FIG. 7, the interlayer insulating film 10 is provided on the first main surface of the semiconductor substrate 11 including the trench gate 2, and the gate wiring 3 and the gate pad 4 are provided on the interlayer insulating film 10.

Note that, in FIG. 6, the interlayer insulating film 10 is not illustrated. Furthermore, in order to clearly illustrate the shape of four of the built-in gate resistance trenches 8 and the position of a built-in gate resistance contact 9, illustration of a part of the wiring side contact region 30 and a part of the pad side contact region 40 existing on four of the built-in gate resistance trenches 8 is omitted in FIG. 6.

In the structure illustrated in FIG. 6, all of four of the built-in gate resistance trenches 8 function as practical built-in gate resistance trenches. That is, K (M≥K≥2) of M of the built-in gate resistance trenches 8 are practical built-in gate resistance trenches. In the first preferred embodiment, {K=M=4} is established.

As illustrated in FIGS. 6 and 7, a first end portion on the −X side of each of four of the built-in gate resistance trenches 8 is electrically connected to the wiring side contact region 30 of the gate wiring 3 via the wiring contact 9L provided penetrating the interlayer insulating film 10.

A second end portion on the +X side of each of four of the built-in gate resistance trenches 8 is electrically connected to the pad side contact region 40 of the gate pad 4 via the pad contact 9P provided penetrating the interlayer insulating film 10.

Hereinafter, the wiring contact 9L and the pad contact 9P may be collectively referred to as the "built-in gate resistance contact 9". That is, the built-in gate resistance contact 9 includes the wiring contact 9L and the pad contact 9P.

Therefore, in each of four of the built-in gate resistance trenches 8 each functioning as a practical built-in gate resistance trench, a gate current path is provided between the pad contact 9P and the wiring contact 9L, and a distance between the wiring contact 9L, and the pad contact 9P in the gate current path is defined as the inter-contact distance Lr.

Therefore, the resistance value R0 of the built-in gate resistance unit 7 in one unit has a characteristic satisfying Equation (1) below using the above-described parameters {Lr, K, Wr, Dr}. Note that, in the first preferred embodiment, the resistance trench width Wr is assumed to be constant in the depth direction.

$$R0 \propto Lr/(K \times Sr) \tag{1}$$

Note that, in Equation (1), {Sr=Wr×Dr}, and Sr is a cross-sectional area in a YZ plane.

In the first preferred embodiment, the trench electrode 8b has a rectangular parallelepiped structure, a cross section in the YZ plane has a rectangular shape, and a cross-sectional area Sr has a rectangular area.

Here, the number K of the practical built-in gate resistance trenches can be adjusted in a range of {1 to M} at the time of manufacturing depending on the presence or absence of the built-in gate resistance contact 9. For example, in one of four of the built-in gate resistance trenches 8, the number K of the practical built-in gate resistance trenches can be set to "three" by omitting electrical connection between the gate wiring 3 and the gate pad 4 by the built-in gate resistance contact 9.

Specifically, a patterning mask for forming the built-in gate resistance contact 9 can be changed so that the built-in gate resistance contact 9 is not formed in one of the built-in gate resistance trenches 8.

In addition, the inter-contact distance Lr can be relatively easily changed by changing arrangement of at least one of the wiring contact 9L and the pad contact 9P.

Specifically, a patterning mask for forming the built-in gate resistance contact 9 can be changed, and the formation position of the built-in gate resistance contact 9 electrically connected to four of the built-in gate resistance trenches 8 can be changed.

As described above, at the time of manufacture of the semiconductor device 101, it is possible to adjust the resistance value R0 of the built-in gate resistance unit 7 in one unit relatively easily by changing the number K of the practical built-in gate resistance trenches and the inter-contact distance Lr.

Further, the interlayer insulating film 10 is a chemical vapor deposition (CVD) film such as a boron phospho silicate glass (BPSG) film or a tetraethylorthosilicate (TEOS) oxide film, and is different from a thermal oxide film such as a silicon oxide film formed by a thermal oxidation method. Note that the CVD film means a film formed by a CVD method, and the thermal oxide film means an oxide film formed by a thermal oxidation method. As the CVD film, a boro-phospho tetraethylorthosilicate (BP-TEOS) oxide film, a phospho silicate glass (PSG) film, aluminum oxide ($Al_2O_3$), and hafnium oxide ($HfO_2$) can be considered.

In a case where the interlayer insulating film 10 is a thermal oxide film, stress due to a thermal oxide film having a relatively large film thickness is generated, and the resistance value R0 of the built-in gate resistance unit 7 may fluctuate.

In the first preferred embodiment, the interlayer insulating film 10 is a CVD film. In a case where a CVD film and a thermal oxide film are formed to have the same film thickness, the CVD film has a stress suppression characteristic in which stress applied to a peripheral region including the semiconductor substrate 11 and the trench gate 2 is smaller than that of the thermal oxide film. Therefore, in the first preferred embodiment, by forming a CVD film having a relatively small film thickness of about 0.1 µm to 0.8 µm as the interlayer insulating film 10, the stress caused by the interlayer insulating film 10 is reduced, so that the fluctuation of the resistance value R0 of the built-in gate resistance unit 7 can be suppressed.

Note that the built-in gate resistance contact 9 can be formed by embedding a W plug or the like, or can be formed by embedding metal for forming the gate wiring 3 or the gate pad 4. Note that AlSi, AlSiC, or the like can be considered as metal for forming the gate wiring 3 and the gate pad 4.

Further, in order to improve the embeddability of the built-in gate resistance contact 9, the built-in gate resistance contact 9 may be tapered so as to be inclined inward toward the lower side. Note that, since contact resistance between the built-in gate resistance contact 9 and the trench electrode 8b of the built-in gate resistance trench 8 is sufficiently small, the presence or absence of the tapering of the built-in gate resistance contact 9 does not affect a resistance value per the built-in gate resistance trench 8.

As described above, the trench insulating film 8a is provided on an inner wall of the built-in gate resistance trench 8, and the trench electrode 8b facing the semiconductor substrate 11 of the first conductivity type is provided with the trench insulating film 8a interposed between them.

The trench insulating film 8a may be a thermal oxide film or a CVD film. The trench electrode 8b is polysilicon added with impurities, and the added impurities may be $1 \times 10^{18}$ $cm^{-2}$ or more. For example, phosphorus and the like are considered as impurities to be added, and for example, doped polysilicon is considered as polysilicon.

By forming the trench electrode 8b with doped polysilicon, the contact resistance between the gate wiring 3 or the gate pad 4 and the trench electrode 8b can be reduced.

As described above, the built-in gate resistance region 5 of the semiconductor device 101 of the first preferred embodiment includes four of the built-in gate resistance units 7. Four of the built-in gate resistance units 7 function as N (N≥2) of partial built-in gate resistance regions connected in parallel between the gate wiring 3 and the gate pad 4. In the first preferred embodiment, {N=4} is established.

Then, each of four of the built-in gate resistance units 7 includes four of the built-in gate resistance trenches 8. Four of the built-in gate resistance trenches are M (M≥2) of the built-in gate resistance trenches 8 connected in parallel between the gate wiring 3 and the gate pad 4. In the first preferred embodiment, {M=4} is established.

K (M≥K≥2) of four of the built-in gate resistance trenches 8 function as practical built-in gate resistance trenches. In the first preferred embodiment, {K=M=4} is established.

In the semiconductor device 101 of the first preferred embodiment, each of four of the built-in gate resistance units 7 included in the built-in gate resistance region 5 has four of the built-in gate resistance trenches 8. All of four of the built-in gate resistance trenches 8 function as practical built-in gate resistance trenches.

Each of four of the built-in gate resistance trenches 8 is electrically connected to the gate wiring 3 via the wiring contact 91, and is electrically connected to the gate pad 4 via the pad contact 9P.

Then, in each of four of the built-in gate resistance trenches 8, a gate current path is provided between the wiring contact 9L, and the pad contact 9P, and a distance between the wiring contact 9L and the pad contact 9P in the gate current path is defined as the inter-contact distance Lr.

Therefore, in the semiconductor device 101 of the first preferred embodiment, since the resistance value R0 of one unit of the built-in gate resistance unit 7 is determined by Equation (1) described above, the resistance value R0 can be adjusted at the time of manufacturing by the number K of practical built-in gate resistance trenches arranged in parallel and the inter-contact distance Lr.

Note that the resistance value of the built-in gate resistance region 5 is a combined resistance value of four of the built-in gate resistance units 7.

As a result, in the semiconductor device of the first preferred embodiment, the resistance value of the built-in gate resistance region 5 can be relatively easily adjusted at the time of manufacturing based on the number K of practical built-in gate resistance trenches and the inter-contact distance Lr.

In addition, the interlayer insulating film 10 of the semiconductor device 101 is a CVD film containing at least one of a TEOS oxide film, a BPTEOS oxide film, a PSG film, a BPSG film, aluminum oxide, and hafnium oxide. The CVD film has the above-described stress suppression characteristic, and can be formed with a relatively small film thickness of about 0.1 µm to 0.8 µm.

For this reason, it is possible to alleviate stress around four of the built-in gate resistance trenches 8 caused by the interlayer insulating film 10 and suppress a fluctuation in a resistance characteristic of each of four of the built-in gate resistance trenches 8.

Furthermore, the built-in gate resistance region 5 of the semiconductor device 101 of the first preferred embodiment includes four of the built-in gate resistance units 7 provided to face four sides of the pad main region 4M having a rectangular shape in plan view.

Since four of the built-in gate resistance units 7 are provided to face four sides of the pad main region 4M in plan view, a formation length of four of the built-in gate resistance trenches 8 included in each of the built-in gate resistance units 7 can be made relatively long. Therefore, the inter-contact distance Lr of each of four of the built-in gate resistance trenches 8 can be set to such a length by which a desired resistance value can be obtained.

For this reason, in the semiconductor device 101 of the first preferred embodiment, four of the built-in gate resistance units 7 each having a significant resistance value can be provided relatively easily.

Second Preferred Embodiment

Figure 8:
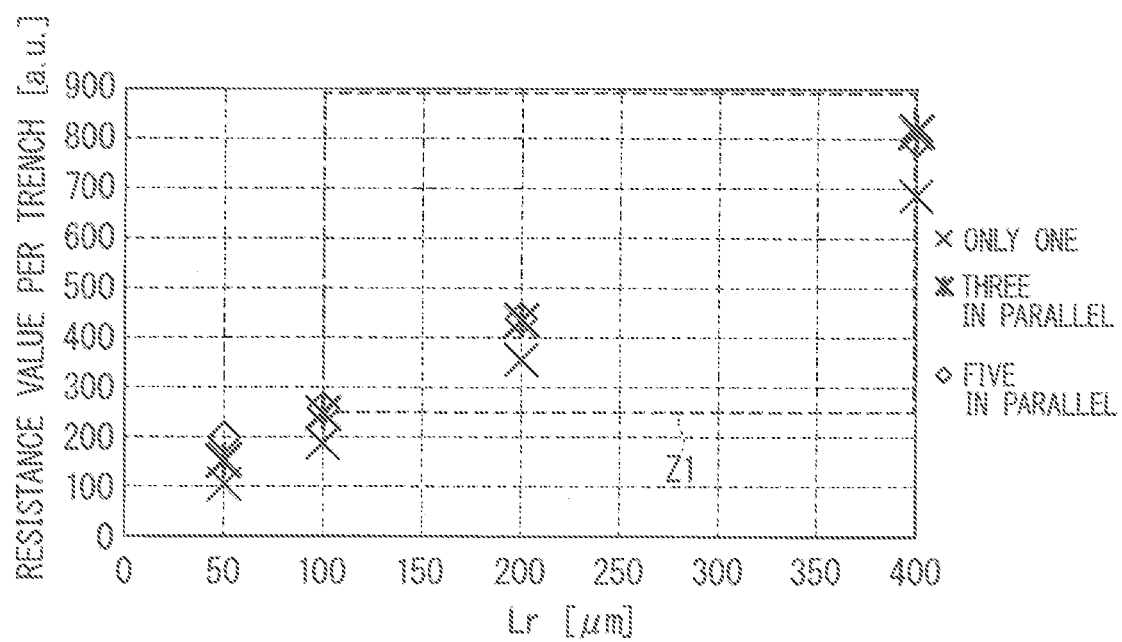
FIG. 8 is a graph illustrating the resistance value dependency of a built-in gate resistance trench in the semiconductor device of the second preferred embodiment.

FIG. 8 is a graph illustrating resistance value dependency of the built-in gate resistance trench 8 functioning as a practical built-in gate resistance trench. In the diagram, the horizontal axis represents the inter-contact distance Lr (µm), and the vertical axis represents a resistance value (a.u; arbitrary unit) per the built-in gate resistance trench 8.

As illustrated in the diagram, a resistance value R8 per the built-in gate resistance trench 8 varies depending on the inter-contact distance Lr and the number K of the trenches arranged in parallel.

In contrast, when the number K of practical built-in gate resistance trenches arranged in parallel in each of the built-in gate resistance units 7 is set to three or more and the inter-contact distance Lr is set to 100 µm or more, as shown in a focused region Z1, the resistance value R8 per the built-in gate resistance trench 8 is stabilized at a constant value.

As can be seen from FIG. 8, in each of the built-in gate resistance units 7, when the condition that "the number K is three or more, and the inter-contact distance Lr is 100 µm or more" is satisfied, Lr dependency of the resistance value R8 per the built-in gate resistance trench 8 becomes equivalent, and the resistance value R8 is stabilized at a constant value.

A semiconductor device 102 of a second preferred embodiment shows the same structure as that of the first preferred embodiment illustrated in FIGS. 1 to 7, and satisfies Condition (1) and Condition (2) below.

Condition (1) . . . In each of the built-in gate resistance units 7, the number K of the built-in gate resistance trenches 8 arranged in parallel functioning as practical built-in gate resistance trenches is three or more.

Condition (2) . . . the inter-contact distance Lr of the built-in gate resistance trench 8 functioning as a practical built-in gate resistance trench is 100 μm or more.

The semiconductor device 102 according to the second preferred embodiment has the same effect as that of the semiconductor device 101 according to the first preferred embodiment, and further has an effect below.

The semiconductor device 102 according to the second preferred embodiment satisfying Conditions (1) and (2) can stably adjust the resistance value R8 of the built-in gate resistance trench 8 functioning as a practical built-in gate resistance trench.

Third Preferred Embodiment

An entire structure of a semiconductor device 103 of a third preferred embodiment is similar to that of the first preferred embodiment illustrated in FIGS. 1 to 4, and the structure of the gate pad peripheral region A1 is also similar to that of the first preferred embodiment illustrated in FIG. 5. However, the structure in the built-in gate resistance peripheral region B1 in FIG. 5 is different from the structure of the first preferred embodiment illustrated in FIG. 6.

Figure 9:
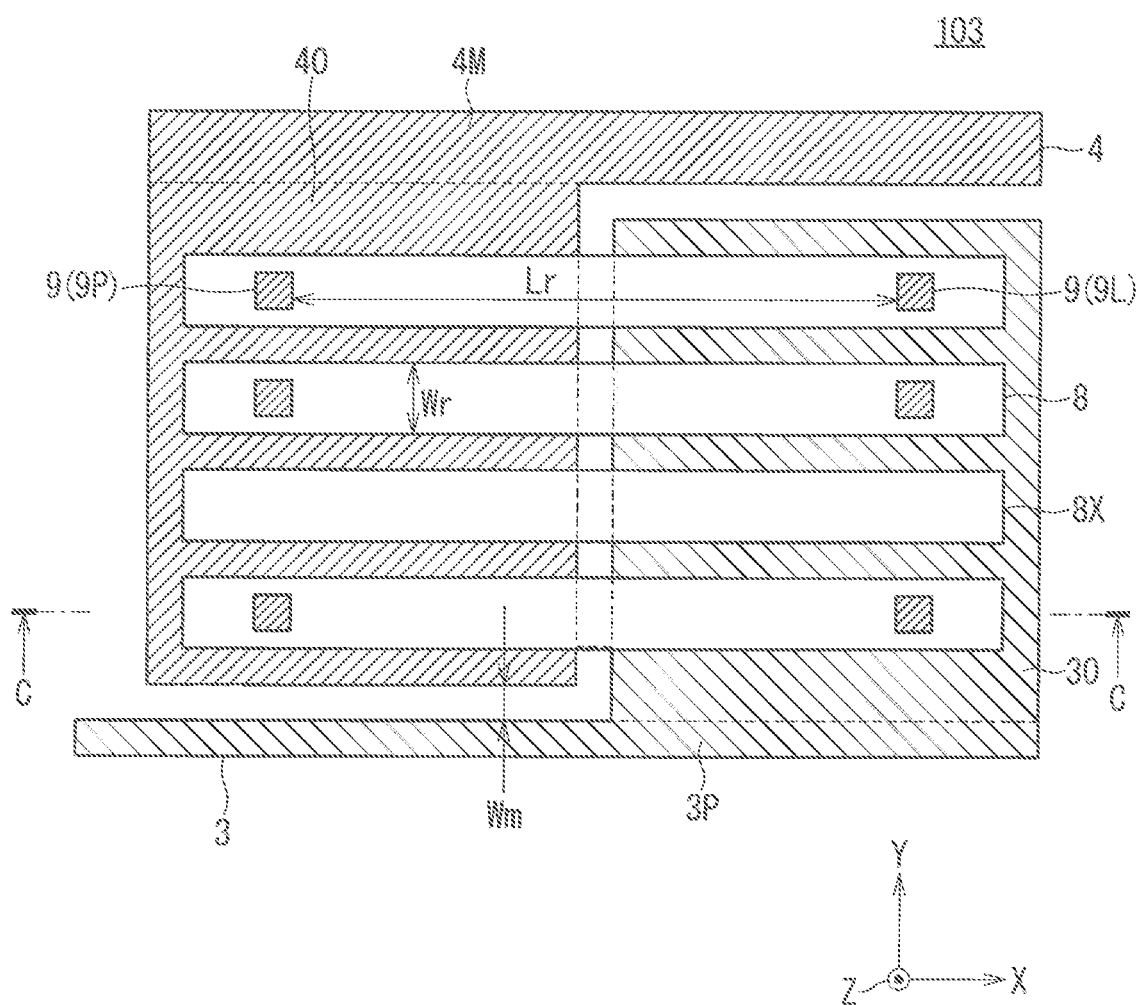
FIG. 9 is an enlarged plan view illustrating a built-in gate resistance peripheral region in the semiconductor device according to the third preferred embodiment.

FIG. 9 is an enlarged plan view illustrating the built-in gate resistance peripheral region B1 illustrated in FIG. 5 in the semiconductor device 103 of the third preferred embodiment. Note that FIG. 7 is a cross-sectional view illustrating a cross-sectional structure taken along line C-C in FIG. 9. An XYZ orthogonal coordinate system is illustrated in FIG. 9.

Hereinafter, the same structures as those of the first preferred embodiment illustrated in FIG. 6 will be denoted by the same reference numerals and omitted from description as appropriate, and a feature of the third preferred embodiment will be mainly described.

In the semiconductor device 103, similarly to the first preferred embodiment, the gate wiring 3 has the wiring side contact region 30 overlapping M of the built-in gate resistance trenches 8 in plan view, and the gate pad 4 has the pad side contact region 40 overlapping M of the built-in gate resistance trenches 8 in plan view. In the example illustrated in FIG. 9, {M=4} is established.

As illustrated in FIG. 9, four of the built-in gate resistance trenches 8 have the same shape. That is, each of four of the built-in gate resistance trenches 8 has a rectangular shape in plan view having a long side in the X direction as the first direction and a short side in the Y direction as the second direction, and the Y direction intersects the X direction at a right angle.

Four of the built-in gate resistance trenches 8 are classified into first to fourth built-in gate resistance trenches arranged in the order of first, second, third, and fourth along the Y direction. That is, four of the built-in gate resistance trenches 8 are classified into first to fourth built-in gate resistance trenches from the upper side to the lower side in FIG. 9.

One of four of the built-in gate resistance trenches 8 is an unused built-in gate resistance trench 8X. Specifically, the third built-in gate resistance trench is the unused built-in gate resistance trench 8X, and the first, second, and fourth built-in gate resistance trenches are practical built-in gate resistance trenches.

Therefore, the first built-in gate resistance trench and the fourth built-in gate resistance trench to be the built-in gate resistance trenches at both ends in the Y direction do not correspond to the unused built-in gate resistance trench 8X.

As described above, in the third preferred embodiment, at least one of M of the built-in gate resistance trenches becomes the unused built-in gate resistance trench, and the first built-in gate resistance trench and the M-th built-in gate resistance trench do not correspond to at least one unused built-in gate resistance trench.

In the third preferred embodiment, the number of at least one unused built-in gate resistance trench is "one", and {M=4} is established.

Since the built-in gate resistance contact 9 overlapping the unused built-in gate resistance trench 8X in plan view is not formed, the unused built-in gate resistance trench 8X does not have an electrical connection relationship with each of the gate wiring 3 and the gate pad.

Therefore, in the structure illustrated in FIG. 9, three of four of the built-in gate resistance trenches 8 excluding the unused built-in gate resistance trench 8X function as practical built-in gate resistance trenches. That is, K (M≥K≥2) of M of the built-in gate resistance trenches 8 function as practical built-in gate resistance trenches. In the third preferred embodiment, since {K=3}, the relationship of {M>K} is established.

As illustrated in FIGS. 9 and 7, a first end portion of each of three of the built-in gate resistance trenches 8 excluding the unused built-in gate resistance trench 8X among four of the built-in gate resistance trenches 8 is electrically connected to the pad side contact region 40 of the gate pad 4 via the pad contact 9P provided penetrating the interlayer insulating film 10.

A second end portion of each of the three of the built-in gate resistance trenches 8 described above is electrically connected to the wiring side contact region 30 of the gate wiring 3 via the wiring contact 9L provided penetrating the interlayer insulating film 10.

Therefore, in each of the three of the built-in gate resistance trenches 8 described above, a gate current path is provided between the pad contact 9P and the wiring contact 9L, and a distance between the wiring contact 9L and the pad contact 9P in the gate current path is defined as the inter-contact distance Lr.

The semiconductor device 103 according to the third preferred embodiment has the same effect as that of the semiconductor device 101 according to the first preferred embodiment, and further has an effect below.

In the semiconductor device 103 of the third preferred embodiment, by providing at least one of the unused built-in gate resistance trench 8X, a difference of "one" or more can be provided between the number K of practical built-in gate resistance trenches and the total number M of the built-in gate resistance trenches 8.

The unused built-in gate resistance trench 8X can be realized relatively easily by omitting the formation of the wiring contact 9L and the pad contact 9P.

By reducing the number K of practical built-in gate resistance trenches, that is, the number K of practical built-in gate resistance trenches arranged in parallel, the resistance value R0 of the built-in gate resistance unit 7 serving as a partial built-in gate resistance region can be relatively easily increased.

As a result, in the semiconductor device 103 according to the third preferred embodiment, a resistance value of the built-in gate resistance region 5 including four of the built-in gate resistance units 7 can be relatively easily increased.

Fourth Preferred Embodiment

An entire structure of a semiconductor device 104 of a fourth preferred embodiment is similar to that of the first preferred embodiment illustrated in FIGS. 1 to 4, and the structure of the gate pad peripheral region A1 is also similar to that of the first preferred embodiment illustrated in FIG. 5. However, the structure in the built-in gate resistance peripheral region B1 in FIG. 5 is different from the structure of the first preferred embodiment illustrated in FIG. 6.

Figure 10:
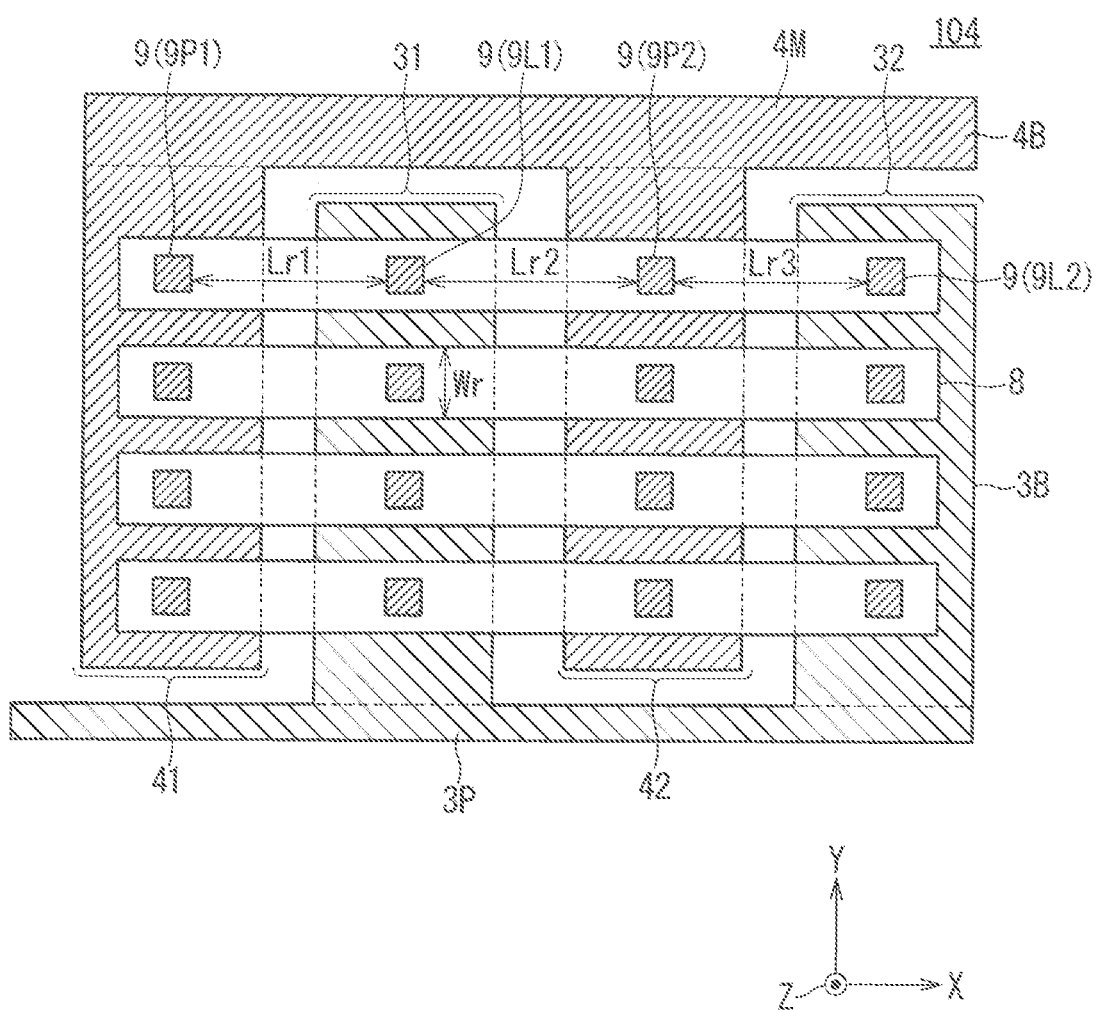
FIG. 10 is an enlarged plan view illustrating the built-in gate resistance peripheral region in the semiconductor device according to a fourth preferred embodiment.

FIG. 10 is an enlarged plan view illustrating the built-in gate resistance peripheral region B1 illustrated in FIG. 5 in the semiconductor device 104 of the fourth preferred embodiment. An XYZ orthogonal coordinate system is illustrated in FIG. 10.

Hereinafter, the same structures as those of the first preferred embodiment illustrated in FIG. 6 will be denoted by the same reference numerals and omitted from description as appropriate, and a feature of the fourth preferred embodiment will be mainly described.

In the fourth preferred embodiment, a gate wiring 3B having a shape different from that of the gate wiring 3 of the first preferred embodiment is provided, and a gate pad 4B having a shape different from that of the gate pad 4 of the first preferred embodiment is provided.

As illustrated in FIG. 10, in the gate pad 4B, two pad side contact regions 41 and 42 are provided extending in the −Y direction from the pad main region 4M, and in the gate wiring 3, two wiring side contact regions 31 and 32 are provided extending in the +Y direction from the outer peripheral wiring region 3P.

As described above, in the fourth preferred embodiment, two of the wiring side contact regions 31 and 32 are included as the wiring side contact region 30, and two of the pad side contact regions 41 and 42 are included as the pad side contact region 40. The pad side contact regions 41 and 42 are a plurality of pad side contact regions, and the wiring side contact regions 31 and 32 are a plurality of wiring side contact regions.

Each of the wiring side contact regions 31 and 32, which are a plurality of wiring side contact regions, overlaps a part of M of the built-in gate resistance trenches 8 in plan view. Each of the pad side contact regions 41 and 42, which are a plurality of pad contact regions, overlaps a part of M of the built-in gate resistance trenches 8 in plan view. In the example illustrated in FIG. 10, {M=4} is established.

As illustrated in FIG. 10, four of the built-in gate resistance trenches 8 have the same shape. That is, each of four of the built-in gate resistance trenches 8 has a rectangular shape in plan view having a long side in the X direction as the first direction and a short side in the Y direction as the second direction, and the Y direction intersects the X direction at a right angle.

The pad side contact regions 41 and 42 and the wiring side contact regions 31 and 32 are provided in the order of the pad side contact region 41, the wiring side contact region 31, the pad side contact region 42, and the wiring side contact region 32 without overlapping each other in plan view along the +X direction. That is, a plurality of pad contact regions and a plurality of wiring side contact regions are alternately provided along the X direction which is the formation direction of the built-in gate resistance trench 8.

In the structure illustrated in FIG. 10, all of four of the built-in gate resistance trenches 8 function as practical built-in gate resistance trenches. That is, K (M≥K≥2) of M of the built-in gate resistance trenches 8 function as practical built-in gate resistance trenches. In the fourth preferred embodiment, {K=M=4} is established.

As illustrated in FIG. 10, each of four of the built-in gate resistance trenches 8 is electrically connected to the wiring side contact region 31 via a wiring contact 9L1, and is electrically connected to the wiring side contact region 32 via a wiring contact 9L2. Therefore, the wiring contacts 9L1 and 9L2 and the wiring side contact regions 31 and 32 correspond to each other on a one-to-one basis. The wiring contacts 9L1 and 9L2 are a plurality of wiring contacts.

Similarly, each of four of the built-in gate resistance trenches 8 is electrically connected to the pad side contact region 41 via a pad contact 9P1, and is electrically connected to the pad side contact region 42 via a pad contact 9P2. Therefore, the pad contacts 9P1 and 9P2 and the pad side contact regions 41 and 42 correspond to each other on a one-to-one basis. The pad contacts 9P1 and 9P2 are a plurality of pad contacts.

The pad contacts 9P1 and 9P2 and the wiring contacts 9L1 and 9L2 are discretely arranged in the order of the pad contact 9P1, the wiring contact 9L1, the pad contact 9P2, and the wiring contact 9L2 along the +X direction.

Therefore, in each of four of the built-in gate resistance trenches 8, the first partial gate current path is provided between the pad contact 9P1 and the wiring contact 9L1. Similarly, a second partial gate current path is provided between the wiring contact 9L1 and the pad contact 9P2, and a third partial gate current path is provided between the pad contact 9P2 and the wiring contact 9L2.

As described above, in each of the built-in gate resistance trenches 8, the gate current path includes the first to third partial gate current paths connected in parallel between the gate wiring 3B and the gate pad 4B as a plurality of partial gate current paths.

As described above, a plurality of partial gate current paths are provided between one built-in gate wiring contact of the pad contacts 9P1 and 9P2 and one built-in gate pad contact of the wiring contacts 9L1 and 9L2.

Then, a distance between the wiring contact 9L1 and the pad contact 9P1 in the first partial gate current path is defined as an inter-contact distance Lr1. A distance between the wiring contact 9L1 and the pad contact 9P2 in the second partial gate current path is defined as an inter-contact distance Lr2. A distance between the wiring contact 9L2 and the pad contact 9P2 in the third partial gate current path is defined as an inter-contact distance Lr3. All the inter-contact distances Lr1 to Lr3 may be set to be the same, or may be set to be different distances between the inter-contact distances Lr1 to Lr3.

The semiconductor device 104 according to the fourth preferred embodiment has the same effect as that of the semiconductor device 101 according to the first preferred embodiment, and further has an effect below.

In the semiconductor device 104 of the fourth preferred embodiment, a gate current path of each of four of the built-in gate resistance trenches 8 functioning as a practical built-in gate resistance trench includes the first to third partial gate current paths connected in parallel between the gate wiring 3B and the gate pad 4B.

By providing the first to third partial gate current paths connected in parallel in each of four of the built-in gate resistance trenches 8, the substantial number of practical built-in gate resistance trenches arranged in parallel in one unit of the built-in gate resistance unit 7 can be increased from "K" to "3×K". For this reason, the resistance value R0 of the built-in gate resistance unit 7 including four of the built-in gate resistance trenches 8 is reduced as compared with the resistance value in a case where the number of the trenches arranged in parallel is "K".

In addition, in a case where the formation length in the X direction of each of four of the built-in gate resistance trenches 8 is assumed to be the same as that in the first preferred embodiment, each of the inter-contact distances Lr1 to Lr3 is shorter than the inter-contact distance Lr.

Therefore, the semiconductor device 104 of the fourth preferred embodiment can relatively easily reduce a resistance value of the built-in gate resistance region 5 at the time of manufacturing.

Fifth Preferred Embodiment

The entire structure of a semiconductor device 105 of a fifth preferred embodiment is similar to that of the first preferred embodiment illustrated in FIGS. 1 to 4. The structure of the gate pad peripheral region A1 is also substantially the same as that of the first preferred embodiment illustrated in FIG. 5. However, the structure in the built-in gate resistance peripheral region B1 in FIG. 5 is different from the structure of the first preferred embodiment illustrated in FIG. 6.

Figure 11:
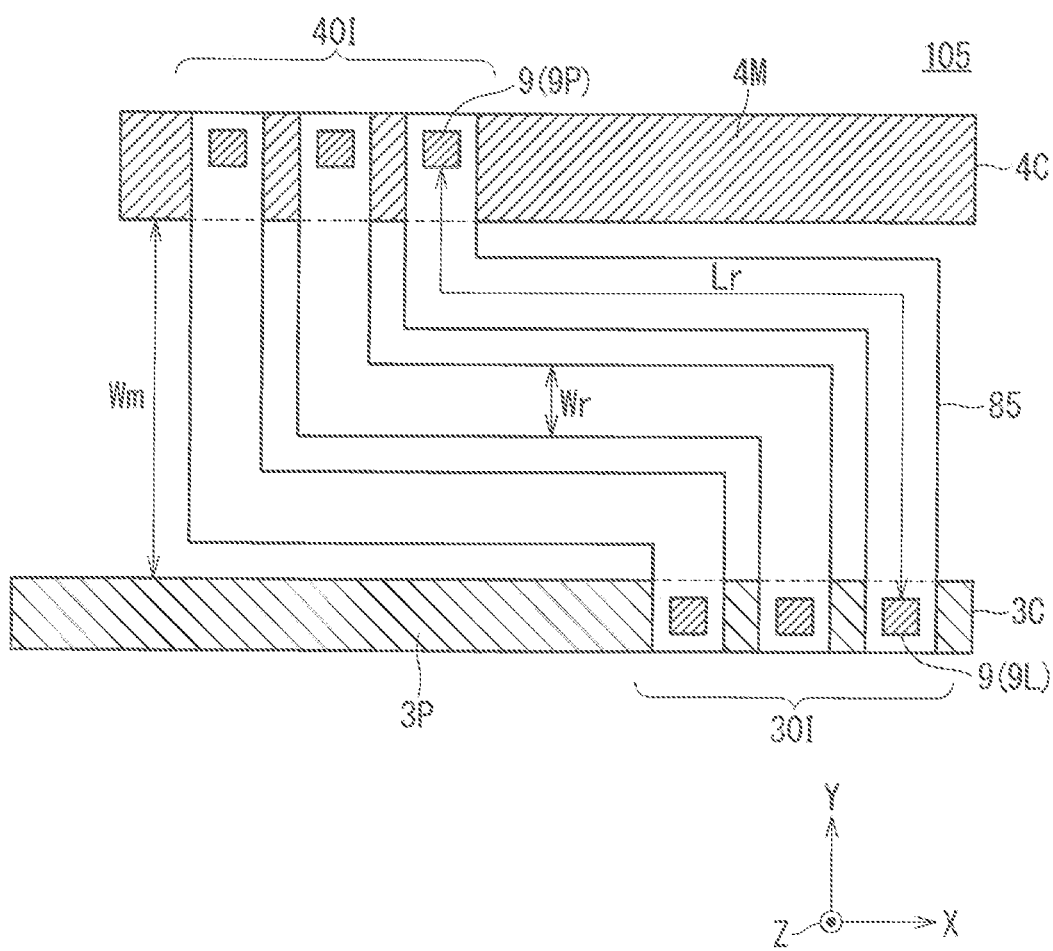
FIG. 11 is an enlarged plan view illustrating the built-in gate resistance peripheral region in the semiconductor device according to a fifth preferred embodiment.

FIG. 11 is an enlarged plan view illustrating the built-in gate resistance peripheral region B1 illustrated in FIG. 5 in the semiconductor device 105 of the fifth preferred embodiment. An XYZ orthogonal coordinate system is illustrated in FIG. 11.

Hereinafter, the same structures as those of the first preferred embodiment illustrated in FIG. 6 will be denoted by the same reference numerals and omitted from description as appropriate, and a feature of the fifth preferred embodiment will be mainly described.

In the fifth preferred embodiment, a gate wiring 3C having a shape different from that of the gate wiring 3 of the first preferred embodiment is provided, and a gate pad 4C having a shape different from that of the gate pad 4 of the first preferred embodiment is provided.

As illustrated in FIG. 11, in the gate pad 4C, a pad side contact region 40I is provided along the X direction in the pad main region 4M, and in the gate wiring 3C, a wiring side contact region 30I is provided along the X direction in the outer peripheral wiring region 3P.

In this manner, both the wiring side contact region 30I and the pad side contact region 40I are provided along the X direction which is a contact region formation direction. That is, the contact region formation direction coincides with the X direction which is a formation length direction of the gate wiring 3C and the gate pad 4C.

The wiring side contact region 30I and the pad side contact region 40I are arranged to be separated by the inter-pad wiring distance Wm in the Y direction that is a direction in which the regions face each other. The Y direction intersects the X direction at a right angle.

The pad side contact region 40I overlaps a first end portion on the +Y direction side of each of M built-in gate resistance trenches 85 in plan view, and the wiring side contact region 30I overlaps a second end portion on the −Y direction side of each of M of the built-in gate resistance trenches 85 in plan view. In the example illustrated in FIG. 11, {M=3} is established.

Similarly to the built-in gate resistance trench 8 of the first preferred embodiment, each of three of the built-in gate resistance trenches 85 includes the trench insulating film 8a and the trench electrode 8b as main constituent elements.

In the structure illustrated in FIG. 11, all of three of the built-in gate resistance trenches 85 function as practical built-in gate resistance trenches. That is, K (M≥K≥2) of M of the built-in gate resistance trenches 85 function as practical built-in gate resistance trenches. In the example illustrated in FIG. 11, {K=M=3} is established.

Three of the built-in gate resistance trenches 85 each functioning as a practical built-in gate resistance trench have a first formation region extending in the X direction and a second formation region extending in the Y direction, and are partially bent in plan view.

As illustrated in FIG. 11, the first end portion of each of three of the built-in gate resistance trenches 85 is electrically connected to the pad side contact region 40I via the pad contact 9P. The second end portion of each of three of the built-in gate resistance trenches 85 is electrically connected to the pad side contact region 40I via the wiring contact 9L.

Therefore, in each of three of the built-in gate resistance trenches 85, a bent gate current path is provided between the pad contact 9P and the wiring contact 9L.

The resistance trench width Wr of each of three of the built-in gate resistance trenches 85 is set to be the same. The resistance trench width Wr of each of the built-in gate resistance trench 85 has a constant value even between regions before and after bending. Furthermore, the bent inter-contact distance Lr between the pad contact 9P and the wiring contact 9L of each of three of the built-in gate resistance trenches 85 is set to be the same. The distance between the wiring contact 9L and the pad contact 9P in the gate current path is defined as the inter-contact distance Lr.

The semiconductor device 105 according to the fifth preferred embodiment has the same effect as that of the semiconductor device 101 according to the first preferred embodiment, and further has an effect below.

In the semiconductor device 105 according to the fifth preferred embodiment, since the wiring side contact region 30I and the pad side contact region 40I are arranged to be separated by the inter-pad wiring distance Wm in the Y direction which is a direction in which the regions face each other, the inter-pad wiring distance Wm can be set to be relatively long.

This is because the wiring side contact region 30I is provided in the outer peripheral wiring region 3P, and the pad side contact region 40I is provided in the pad main region 4M. This is clear from the comparison between the inter-pad wiring distance Wm in the first preferred embodiment illustrated in FIG. 6 and the inter-pad wiring distance Wm in the fifth preferred embodiment illustrated in FIG. 11.

Therefore, in the semiconductor device 105 of the fifth preferred embodiment, the short circuit phenomenon in which the gate wiring 3C and the gate pad 4C are electrically connected due to variation in a manufacturing process can be effectively suppressed.

Furthermore, since each of three of the built-in gate resistance trenches 85 functioning as a practical built-in gate resistance trench has the first formation region along the X direction and the second formation region along the Y direction, it is possible to secure the inter-contact distance Lr having a length by which a significant resistance value can be set.

Furthermore, in the semiconductor device 105, by sufficiently increasing the inter-pad wiring distance Wm, it is possible to improve the embedding property of a sealing material when space between the gate pad 4C and the gate wiring 3C of the semiconductor device 105 is sealed with the sealing material such as resin or gel.

Note that each of three of the built-in gate resistance trenches 85 may have a meandering shape, or has an intermediate region arranged under a non-contact region of the gate wiring 3C or the gate pad 4C. Note that an intermediate region of the built-in gate resistance trench 85 means a region where the built-in gate resistance contact 9 is not formed, and the non-contact region means a region of the gate wiring 3C excluding the wiring side contact region 30I or a region of the gate pad 4C excluding the pad side contact region 40I.

Sixth Preferred Embodiment

The entire structure of a semiconductor device 106 of a sixth preferred embodiment is similar to that of the first preferred embodiment illustrated in FIGS. 1 to 4.

The structure of the gate pad peripheral region A1 is also substantially the same as that of the first preferred embodiment illustrated in FIG. 5. However, the structure in the built-in gate resistance peripheral region B1 in FIG. 5 is different from the structure of the first preferred embodiment illustrated in FIG. 6.

Figure 12:
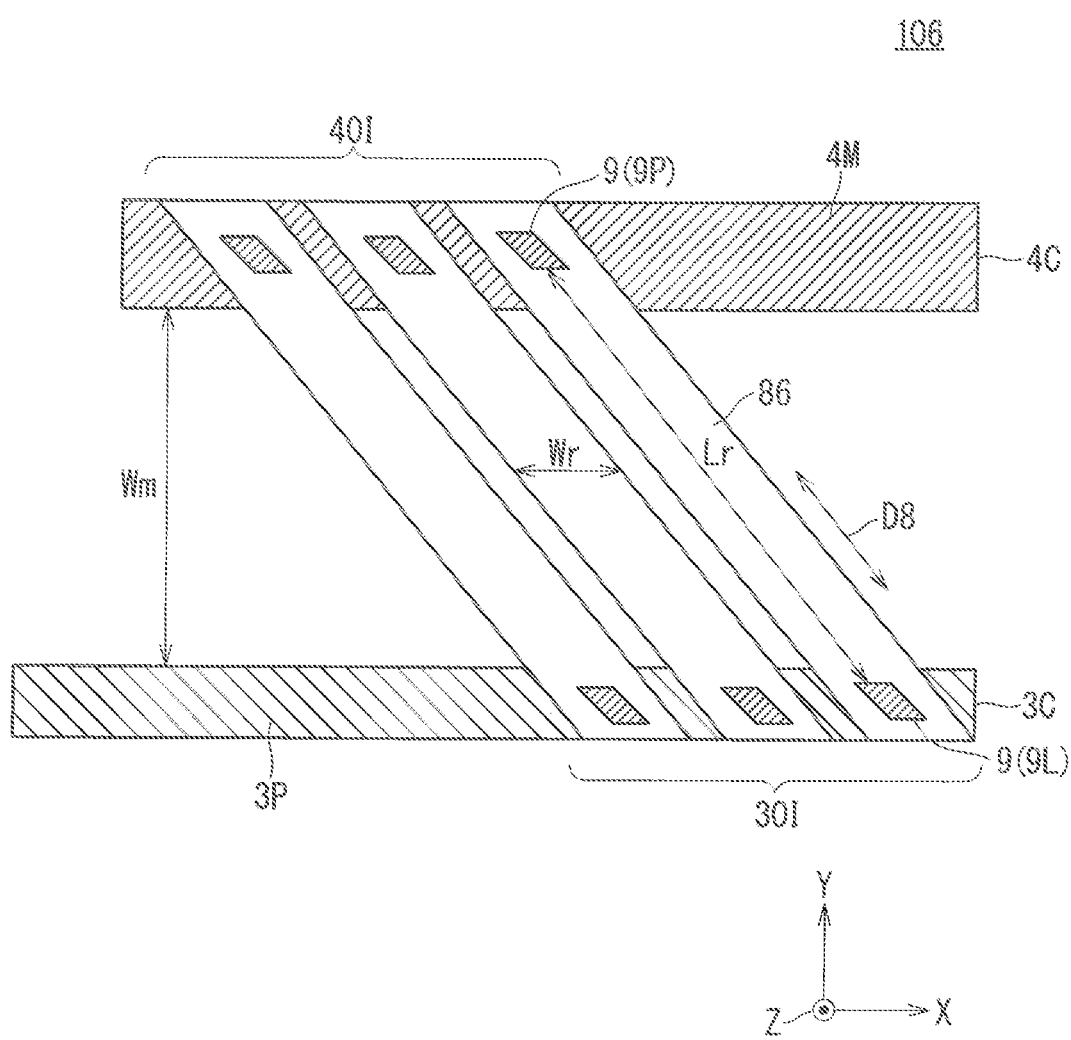
FIG. 12 is an enlarged plan view illustrating the built-in gate resistance peripheral region in the semiconductor device according to a sixth preferred embodiment.

FIG. 12 is an enlarged plan view illustrating the built-in gate resistance peripheral region B1 illustrated in FIG. 5 in the semiconductor device 106 of the sixth preferred embodiment. An XYZ orthogonal coordinate system is illustrated in FIG. 12.

Hereinafter, the same structures as those of the first preferred embodiment illustrated in FIG. 6 or the fifth preferred embodiment illustrated in FIG. 11 will be denoted by the same reference numerals and omitted from description as appropriate, and a feature of the sixth preferred embodiment will be mainly described.

As illustrated in FIG. 12, in the gate pad 4C, the pad side contact region 40I is provided along the X direction in the pad main region 4M, and in the gate wiring 3C, the wiring side contact region 30I is provided along the X direction in the outer peripheral wiring region 3P.

In this manner, both the wiring side contact region 30I and the pad side contact region 40I are provided along the X direction which is a contact region formation direction.

The wiring side contact region 30I and the pad side contact region 40I are arranged to be separated by the inter-pad wiring distance Wm in the Y direction that is a direction in which the regions face each other. The Y direction intersects the X direction at a right angle.

The pad side contact region 40I overlaps a first end portion on the +Y direction side of each of M built-in gate resistance trenches 86 in plan view, and the wiring side contact region 30I overlaps a second end portion on the -Y direction side of each of M of the built-in gate resistance trenches 86 in plan view. In the example illustrated in FIG. 12, {M=3} is established.

Similarly to the built-in gate resistance trench 8 of the first preferred embodiment, each of three of the built-in gate resistance trenches 86 includes the trench insulating film 8a and the trench electrode 8b as main constituent elements.

In the structure illustrated in FIG. 12, all of three of the built-in gate resistance trenches 86 function as practical built-in gate resistance trenches. That is, K (M≥K≥2) of M of the built-in gate resistance trenches 86 function as practical built-in gate resistance trenches. Here, {K=M=3} is established.

Each of three of the built-in gate resistance trenches 86 functioning as a practical built-in gate resistance trench has a parallelogram shape in plan view with a short side in the X direction and a long side in an oblique direction D8. In each of three of the built-in gate resistance trenches 86, the short side direction is the X direction, and the long side direction is the oblique direction D8. The oblique direction D8 is a direction intersecting the X direction and the Y direction.

As illustrated in FIG. 12, a first end portion of each of three of the built-in gate resistance trenches 86 is electrically connected to the pad side contact region 40I via the pad contact 9P, and a second end portion of each of three of the built-in gate resistance trenches 86 is electrically connected to the wiring side contact region 30I via the wiring contact 9L.

Therefore, in each of three of the built-in gate resistance trenches 86, a gate current path is provided between the pad contact 9P and the wiring contact 9L.

The resistance trench width Wr is set to be the same among three of the built-in gate resistance trenches 86, and the inter-contact distance Lr along the oblique direction D8 between the pad contact 9P and the wiring contact 9L is also set to be the same. As described above, the distance between the wiring contact 9l and the pad contact 9P in the gate current path is defined as the inter-contact distance Lr.

The semiconductor device 106 according to the sixth preferred embodiment has the same effect as that of the semiconductor device 101 according to the first preferred embodiment, and further has an effect below.

In the semiconductor device 106 according to the sixth preferred embodiment, since the wiring side contact region 30I and the pad side contact region 40I are arranged to be separated by the inter-pad wiring distance Wm in the Y direction which is a direction in which the regions face each other, the inter-pad wiring distance Wm can be set to be relatively long like in the fifth preferred embodiment.

Therefore, in the semiconductor device 106 of the sixth preferred embodiment, the short circuit phenomenon in which the gate wiring 3C and the gate pad 4C are electrically connected due to variation in a manufacturing process can be effectively suppressed.

Further, each of three of the built-in gate resistance trenches 86 functioning as a practical built-in gate resistance trench has a parallelogram shape in plan view, and does not have a bent portion unlike the built-in gate resistance trench 85 of the fifth preferred embodiment.

For this reason, in the semiconductor device 106 according to the sixth preferred embodiment, the embeddability of the trench electrode 8b can be improved, and the accuracy of a resistance value of the built-in gate resistance trench 86 can be improved accordingly.

In addition, since a long side direction of three of the built-in gate resistance trenches 86 each functioning as a practical built-in gate resistance trench is the oblique direction D8, the inter-contact distance Lr having a length by which a significant resistance value can be set can be secured.

In the sixth preferred embodiment, three of the built-in gate resistance trenches 86 are provided in a parallelogram shape in a narrow sense in plan view, but may be provided in a rectangular shape in plan view. In this case, the long side direction of the rectangular shape is the oblique direction D8. Note that the rectangular shape is a special parallelogram and is included in a parallelogram in a broad sense.

Seventh Preferred Embodiment

The entire structure of a semiconductor device 107 of a seventh preferred embodiment is similar to that of the first preferred embodiment illustrated in FIGS. 1 to 4.

Figure 13:
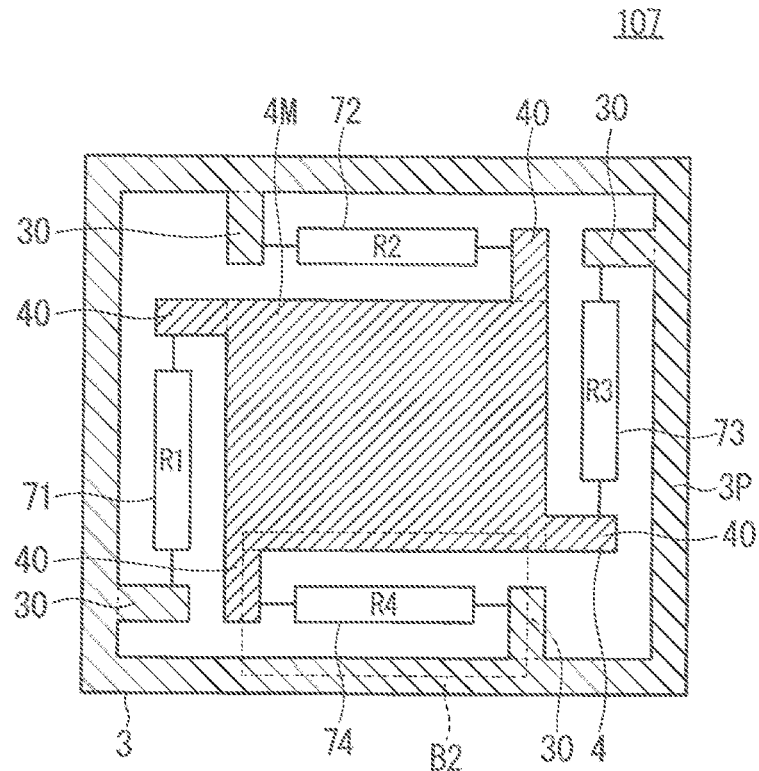
FIG. 13 is an explanatory view schematically illustrating a detailed structure of a gate pad peripheral region in the semiconductor device of a seventh preferred embodiment.

FIG. 13 is an explanatory view schematically illustrating a detailed structure of the gate pad peripheral region A1 in the semiconductor device 107 according to the seventh preferred embodiment. Note that the structure in a built-in gate resistance peripheral region B2 in the semiconductor device 107 is similar to the structure of the first preferred embodiment illustrated in FIGS. 6 and 7.

Hereinafter, the same structures as those of the first preferred embodiment illustrated in FIG. 5 will be denoted by the same reference numerals and omitted from description as appropriate, and a feature of the seventh preferred embodiment will be mainly described.

Among four of the wiring side contact regions 30 and four of the pad side contact regions 40, any of built-in gate resistance units 71 to 74 is provided between the corresponding wiring side contact region 30 and pad side contact region 40. Therefore, four of the built-in gate resistance units 71 to 74 are provided in one-to-one correspondence with four of the wiring side contact regions 30 and four of the pad side contact regions 40.

The built-in gate resistance unit 71 is provided on the left side in the diagram and is set to a resistance value R1, the built-in gate resistance unit 72 is provided on the upper side in the diagram and is set to a resistance value R2, the built-in gate resistance unit 73 is provided on the right side in the diagram and is set to a resistance value R3, and the built-in gate resistance unit 74 is provided on the lower side in the diagram and is set to a resistance value R4.

The corresponding wiring side contact region 30 and pad side contact region 40 are electrically connected by each of the built-in gate resistance units 71 to 74.

The built-in gate resistance units 71 to 74 function as N partial built-in gate resistance regions, are provided to face four sides of the pad main region 4M in plan view, and are classified into first to fourth partial built-in gate resistance regions. That is, the built-in gate resistance unit 71 becomes a first partial built-in gate resistance region, the built-in gate resistance unit 72 becomes a second partial built-in gate resistance region, the built-in gate resistance unit 73 becomes a third partial built-in gate resistance region, and the built-in gate resistance unit 74 becomes a fourth partial built-in gate resistance region.

The semiconductor device 107 according to the seventh preferred embodiment is characterized in that the resistance values R1 to R4 of the built-in gate resistance units 71 to 74 are set to values different from each other.

The semiconductor device 107 according to the seventh preferred embodiment has the same effect as that of the semiconductor device 101 according to the first preferred embodiment, and further has an effect below.

In the semiconductor device 107 of the seventh preferred embodiment, the resistance values R1 to R4 of the built-in gate resistance units 71 to 74 to be the first to fourth partial built-in gate resistance regions are set to values different from each other, an adjustment range of a resistance value of the built-in gate resistance region 5 can be made relatively wide.

Note that, although the resistance values R1 to R4 of the built-in gate resistance units 71 to 74 are set to different values, some of the resistance values R1 to R4 may be set to the same resistance value.

Eighth Preferred Embodiment

The entire structure of a semiconductor device 108 of an eighth preferred embodiment is similar to that of the first preferred embodiment illustrated in FIGS. 1 to 4.

Figure 14:
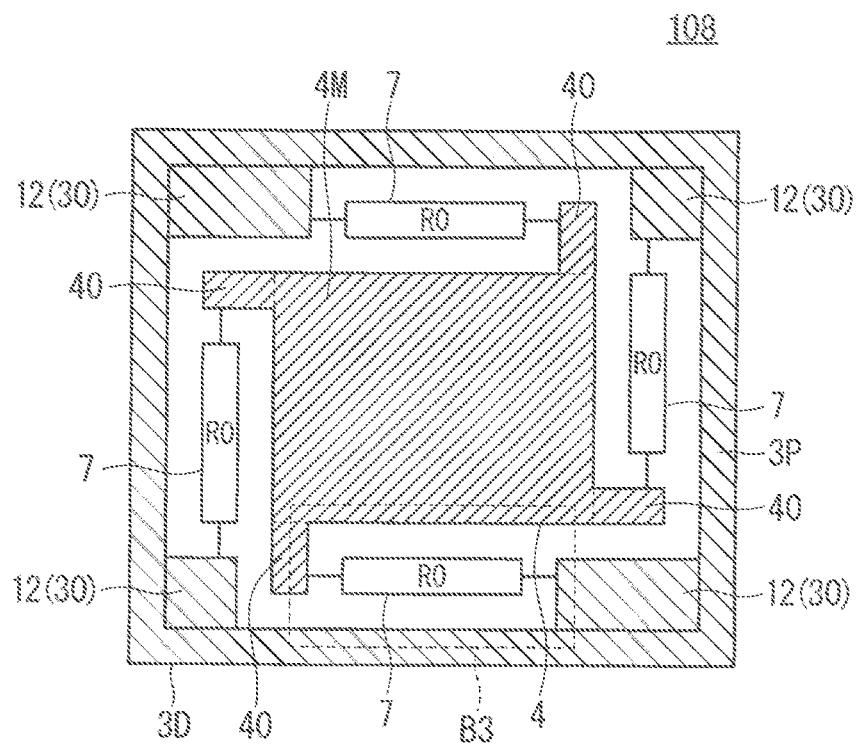
FIG. 14 is an explanatory view schematically illustrating a detailed structure of a gate pad peripheral region in the semiconductor device of an eighth preferred embodiment.

FIG. 14 is an explanatory view schematically illustrating a detailed structure of the gate pad peripheral region A1 in the semiconductor device 108 according to the eighth preferred embodiment. Note that the structure in a built-in gate resistance peripheral region B3 in the semiconductor device 108 is almost the same as the structure of the first preferred embodiment illustrated in FIGS. 6 and 7.

Hereinafter, the same structure as that of the first preferred embodiment illustrated in FIG. 5 will be denoted by the same reference numerals and omitted from description as appropriate, and a feature of the eighth preferred embodiment will be mainly described.

In the eighth preferred embodiment, a gate wiring 3D has a shape different from that of the gate wiring 3 of the first preferred embodiment.

As illustrated in FIG. 14, the gate wiring 31) includes an outer peripheral wiring region 3P provided along the outer periphery of the gate pad 4 and four built-in gate resistance measurement pads 12 provided in four corners of the outer peripheral wiring region 3P. Each of four of the built-in gate resistance measurement pads 12 is provided in a mode of being in contact with the outer peripheral wiring region 3P. Each of four of the built-in gate resistance measurement pads 12 functions as the wiring side contact region 30. Four of the built-in gate resistance measurement pads 12 and four of the pad side contact regions 40 have a one-to-one correspondence.

Each of four of the built-in gate resistance measurement pads 12 has a measurement region whose surface is exposed. Electrical connection with the outside can be achieved in this measurement region.

Among four of the built-in gate resistance measurement pads 12 and four of the pad side contact regions 40, the built-in gate resistance unit 7 is provided between the corresponding built-in gate resistance measurement pad 12 and pad side contact region 40. Therefore, four of the built-in gate resistance units 7 are provided corresponding to four of the built-in gate resistance measurement pads 12 and four of the pad side contact regions 40.

In the eighth preferred embodiment, as in the first preferred embodiment, four of the built-in gate resistance units 7 have the same resistance value R0. Note that a resistance value of a part of four of the built-in gate resistance units 7 may be set to a different value.

The corresponding built-in gate resistance measurement pad 12 and pad side contact region 40 are electrically connected by die built-in gate resistance unit 7. Regarding the electrical connection of the built-in gate resistance unit 7, the built-in gate resistance measurement pad 12 functions as the wiring side contact region 30.

Four of the built-in gate resistance units 7 are provided to face four sides of the pad main region 4M in plan view. Four of the built-in gate resistance units 7 function as N partial built-in gate resistance regions.

The semiconductor device 108 according to the eighth preferred embodiment has the same effect as that of the semiconductor device 101 according to the first preferred embodiment, and further has an effect below.

The semiconductor device 108 according to the eighth preferred embodiment can measure a resistance value of the built-in gate resistance region 5 by using the built-in gate resistance measurement pad 12 functioning as the wiring side contact region 30 and a measurement region for external connection.

Specifically, a resistance value of the built-in gate resistance region 5, that is, a combined resistance value of four of the built-in gate resistance units 7 each having the resistance value R0 can be measured by measuring voltage between the gate pad 4 and the built-in gate resistance measurement pad 12 or current flowing between the gate pad 4 and the built-in gate resistance measurement pad 12.

Note that, in the eighth preferred embodiment, four of the built-in gate resistance measurement pads 12 are provided. However, the above effect can be achieved as at least one of the built-in gate resistance measurement pad 12 is provided corresponding to at least one of four of the built-in gate resistance units 7.

Ninth Preferred Embodiment

The entire structure of a semiconductor device 109 of a ninth preferred embodiment is similar to that of the first preferred embodiment illustrated in FIGS. 1 to 4. The structure of the gate pad peripheral region A1 is also the same as that of the first preferred embodiment illustrated in FIG. 5. A planar structure in the built-in gate resistance peripheral region B of FIG. 5 is also the same as that of the first preferred embodiment illustrated in FIG. 6. However, a cross-sectional structure in the built-in gate resistance peripheral region B1 in FIG. 5 is different from that of the first preferred embodiment.

Figure 15:
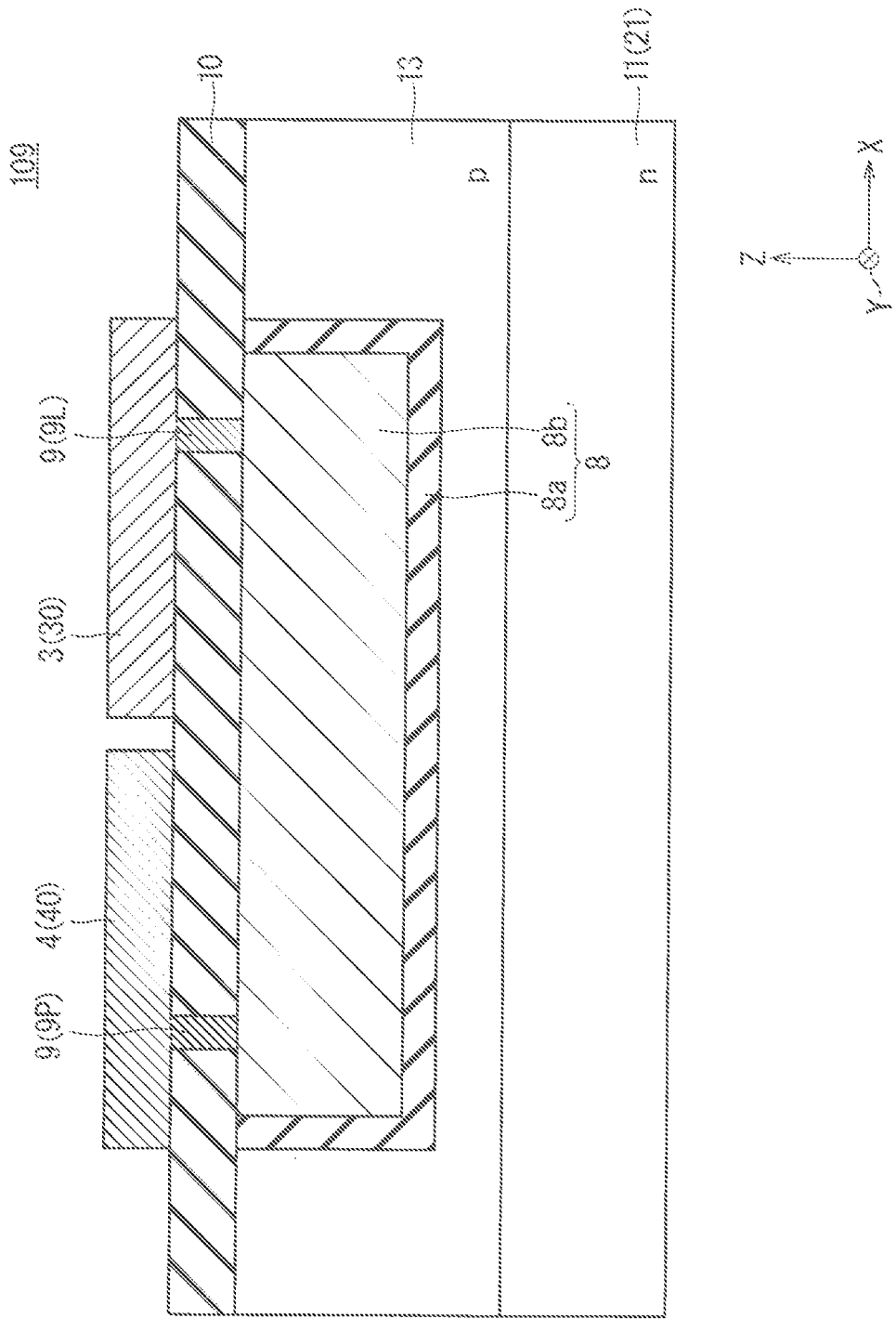
FIG. 15 is a cross-sectional view illustrating a cross-sectional structure taken along line A-A in FIG. 6 in a ninth preferred embodiment.

FIG. 15 is a cross-sectional view illustrating a cross-sectional structure of the semiconductor device 109 of the ninth preferred embodiment taken along line A-A of FIG. 6. An XYZ orthogonal coordinate system is illustrated in FIG. 15.

Hereinafter, the same structure as that of the first preferred embodiment illustrated in FIG. 7 will be denoted by the same reference numeral and omitted from description as appropriate, and a feature of the ninth preferred embodiment will be mainly described.

As illustrated in FIG. 15, a p-type well layer 13 of the second conductivity type is provided in an upper layer portion on the first main surface side of the n-type semiconductor substrate 11. The built-in gate resistance trench 8 is provided on the well layer 13. Note that, in FIG. 15, the semiconductor substrate 11 corresponds to the n-type drift layer 21 to be accurate.

The built-in gate resistance trench 8 is embedded in the well layer 13 of the semiconductor substrate 11, and a bottom portion of the built-in gate resistance trench 8 is present on the well layer 13. Similarly to the first preferred embodiment, the built-in gate resistance trench 8 includes the trench insulating film 8a and the trench electrode 8b as main constituent elements. The trench insulating film 8a is provided so as to cover the entire periphery of the trench electrode 8b. Therefore, the trench electrode 8b does not have an electrical connection relationship with the well layer 13.

The structure illustrated in FIG. 15 is common between M of the built-in gate resistance trenches 8. Therefore, the semiconductor device 109 of the ninth preferred embodiment is characterized in that a bottom portion of M of the built-in gate resistance trenches 8 is present on the p-type well layer 13. That is, M of the built-in gate resistance trenches 8 are covered with the well layer 13. Note that, in the ninth preferred embodiment, {M=K=4} is established similarly to the first preferred embodiment.

The semiconductor device 109 according to the ninth preferred embodiment has the same effect as that of the semiconductor device 101 according to the first preferred embodiment, and further has an effect below.

Since the semiconductor device 109 of the ninth preferred embodiment further includes the p-type well layer 13 of the second conductivity type, an electric field generated in a bottom portion of four of the built-in gate resistance trenches 8 can be relaxed by the well layer 13, and the reliability of a resistance value of four of the built-in gate resistance trenches 8 can be enhanced.

This is because in a case where the well layer 13 is present, the electric field intensity is maximized at a pn junction interface between the p-type well layer 13 of the second conductivity type and the n-type semiconductor substrate 11 of the first conductivity type, and the electric field in the bottom portion of four of the built-in gate resistance trenches 8 can be relaxed.

Tenth Preferred Embodiment

The entire structure of a semiconductor device 110 of a tenth preferred embodiment is similar to that of the first preferred embodiment illustrated in FIGS. 1 to 4. The structure of the gate pad peripheral region A1 is also the same as that of the first preferred embodiment illustrated in FIG. 5. A planar structure in the built-in gate resistance peripheral region B1 of FIG. 5 is also the same as that of the first preferred embodiment illustrated in FIG. 6. However, a cross-sectional structure in the built-in gate resistance peripheral region B1 in FIG. 5 is different from that of the first preferred embodiment illustrated in FIG. 7.

Figure 16:
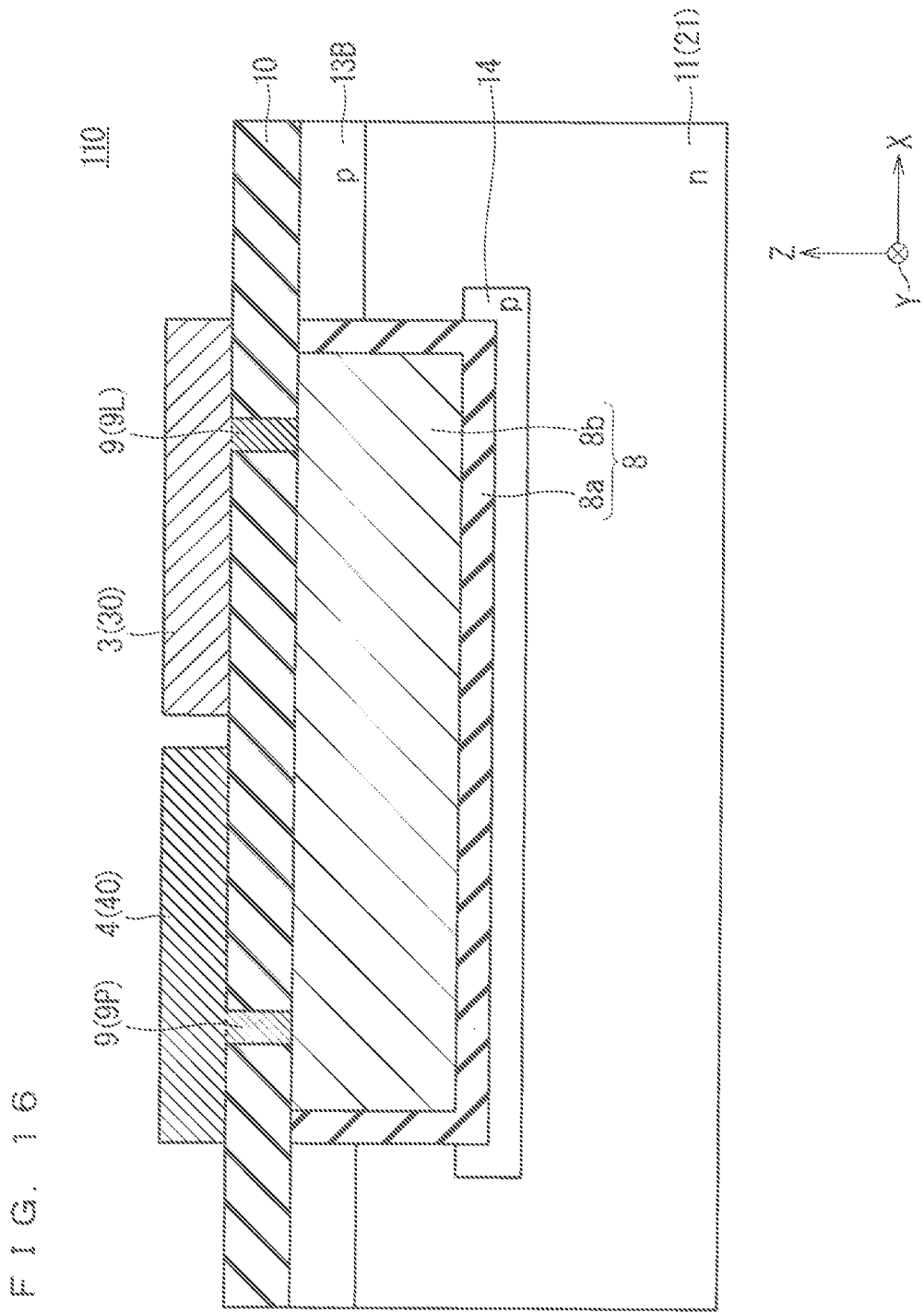
FIG. 16 is a cross-sectional view illustrating a cross-sectional structure taken along line A-A in FIG. 6 in a tenth preferred embodiment.

FIG. 16 is a cross-sectional view illustrating a cross-sectional structure of the semiconductor device 110 of the tenth preferred embodiment taken along line A-A of FIG. 6. An XYZ orthogonal coordinate system is illustrated in FIG. 16.

Hereinafter, the same structure as that of the first preferred embodiment illustrated in FIG. 7 will be denoted by the same reference numeral and omitted from description as appropriate, and a feature of the tenth preferred embodiment will be mainly described.

As illustrated in FIG. 16, a p-type well layer 13B of the second conductivity type is provided in an upper layer portion of the semiconductor substrate 11. The built-in gate resistance trench 8 penetrates the well layer 13B and is embedded in the semiconductor substrate 11. That is, the formation depth of the well layer 13B is shallower than the formation depth of the built-in gate resistance trench. Note that, in FIG. 16, the semiconductor substrate 11 corresponds to the n-type drift layer 21 to be accurate.

A p-type barrier layer 14 of the second conductivity type is selectively formed on the semiconductor substrate 11. The barrier layer 14 is provided so as to cover the bottom portion of the built-in gate resistance trench 8. Therefore, the bottom portion of the built-in gate resistance trench 8 is present in the barrier layer 14.

Similarly to the first preferred embodiment, the built-in gate resistance trench 8 includes the trench insulating film 8a and the trench electrode 8b as main constituent elements. The trench insulating film 8a is provided so as to cover the entire periphery of the trench electrode 8b. Therefore, the trench electrode 8b does not have an electrical connection relationship with the barrier layer 14.

The structure illustrated in FIG. 16 is common between M of the built-in gate resistance trenches 8. Therefore, the semiconductor device 110 of the tenth preferred embodiment is characterized in that the formation depth of the well layer 13B is shallower than the formation depth of M of the built-in gate resistance trenches 8, and the bottom portions of M of the built-in gate resistance trenches 8 are present in the barrier layer 14. Note that, in the tenth preferred embodiment, {M=K=4} is established similarly to the first preferred embodiment.

The semiconductor device 110 according to the tenth preferred embodiment has the same effect as that of the semiconductor device 101 according to the first preferred embodiment, and further has an effect below.

Since the semiconductor device 110 of the tenth preferred embodiment further includes the p-type barrier layer 14 of the second conductivity type, an electric field generated in a bottom portion of four of the built-in gate resistance trenches 8 can be relaxed by the barrier layer 14, and the reliability of a resistance value of four of the built-in gate resistance trenches can be enhanced.

In addition, since the formation depth of the well layer 13B can be made shallower than the formation depth of four of the built-in gate resistance trenches 8, the manufacturing cost of the semiconductor device 110 can be reduced.

Eleventh Preferred Embodiment

The entire structure of a semiconductor device Ill of an eleventh preferred embodiment is similar to that of the first preferred embodiment illustrated in FIGS. 1 to 4. The structure of the gate pad peripheral region A1 is also the same as that of the first preferred embodiment illustrated in FIG. 5. A planar structure and a cross-sectional structure taken along line A-A in the built-in gate resistance peripheral region B1 of FIG. 5 are also similar to those of the first preferred embodiment illustrated in FIGS. 6 and 7.

The semiconductor device 111 of the eleventh preferred embodiment is characterized by a cross-sectional structure taken along line B-B in the built-in gate resistance peripheral region B1 of FIG. 5.

FIG. 17 is a cross-sectional view illustrating a cross-sectional structure of the semiconductor device 111 of the eleventh preferred embodiment taken along line B-B of FIG. 6. An XYZ orthogonal coordinate system is illustrated in FIG. 17.

As illustrated in FIG. 17, an embedded gate electrode 2b of each of four of the built-in gate resistance trenches has the resistance trench depth Dr that is constant. Note that, although FIG. 17 illustrates three of the built-in gate resistance trenches 8, there are actually tour of the built-in gate resistance trenches 8.

As illustrated in FIG. 17, in each of four of the built-in gate resistance trenches 8, a surface of the trench electrode 8b on the first main surface side has a resistance surface width Wt, and a bottom surface of the trench electrode 8b on the second main surface side has a resistance bottom surface width Wh. The resistance surface width Wt is a first formation width, and the resistance bottom surface width Wb is a second formation width.

In the first to tenth preferred embodiments, the trench electrode 8b is assumed to have a rectangular parallelepiped structure. However, in the eleventh preferred embodiment, a case where, at the time of formation a trench for the built-in gate resistance trench 8, the trench is tapered so as to be inclined inward toward the lower side.

In the eleventh preferred embodiment, in consideration of the case where the tapering is made, the trench electrode 8b is formed such that a difference value (Wt−Wb) between the resistance surface width Wt and the resistance bottom surface width Wb satisfies Equation (2) below.

$$(Wt-Wb) \leq Wt/10 \tag{2}$$

The structure illustrated in FIG. 17 is common between M of the built-in gate resistance trenches 8. Therefore, in the semiconductor device 111 according to the eleventh preferred embodiment, in each of M of the built-in gate resistance trenches 8, the trench electrode 8b has the resistance trench depth Dr that is constant, the surface of the trench electrode 8b has the resistance surface width Wt, and the bottom surface of the trench electrode 8b has the resistance bottom surface width Wb. Then, the resistance surface width Wt and the resistance bottom surface width Wb satisfy Equation (2) described above. Note that, in the eleventh preferred embodiment. {M=K=4} is established similarly to the first preferred embodiment.

In the semiconductor device 111 of the eleventh preferred embodiment, the resistance surface width Wt and the resistance bottom surface width Wb satisfy Equation (2) described above in each of four of the built-in gate resistance trenches 8.

The trench for the built-in gate resistance trench 8 satisfying Equation (2) can be realized by using, for example, anisotropic dry etching.

Note that, since the film thickness of the trench insulating film 8a is sufficiently small, Equation (2) can be applied with the formation width of the surface of the built-in gate resistance trench 8 as the resistance surface width Wt and the formation width of the bottom surface of the built-in gate resistance trench 8 as the resistance bottom surface width Wb. That is, the parameter {Wt, Wb} related to Equation (2) can be regarded to be the same between the built-in gate resistance trench 8 and the trench electrode 8b.

In the eleventh preferred embodiment, the resistance value R0 of the built-in gate resistance unit 7 in one unit has a characteristic satisfying Equation (3) below using the above-described parameters {Lr, K, Wt, Wb, Dr}.

$$R0 \propto Lr/(K \times Sr2) \tag{3}$$

Note that, in Equation (3), {Sr2=Dr×(Wt+Wb)/2} is established, and Sr2 is a trapezoidal cross-sectional area on the YZ plane.

From Equation (3), the resistance value R0 of the built-in gate resistance unit 7 in one unit is inversely proportional to the cross-sectional area Sr2. When a trench for the built-in gate resistance trench 8 is formed, the resistance bottom surface width Wb tends to be shorter than the resistance surface width Wt because a taper angle is generated inside during etching.

In contrast, even in the case of the rectangular cross-sectional area Sr in Equation (1) or the trapezoidal cross-sectional area Sr2 in Equation (3), if the cross-sectional area Sr and the cross-sectional area Sr2 can be brought close to constant values, variation in the resistance value R0 obtained by Equations (1) and (3) can be minimized.

Therefore, by providing the built-in gate resistance trench 8 satisfying Equation (2), it is possible to minimize variation in the resistance value R0 obtained by applying Equation (3).

In the semiconductor device 111 according to the eleventh preferred embodiment, since the resistance surface width Wt and the resistance bottom surface width Wb for each of four of the built-in gate resistance trenches 8 are set so as to satisfy Equation (2), it is possible to minimize variation in the resistance value R0 represented by Equation (3).

<Manufacturing Method>

The semiconductor devices 101 to 111 according to the first to eleventh preferred embodiments can be manufactured by Steps (a) to (c) below.

Step (a) . . . Determine the number K of M of the built-in gate resistance trenches 8 functioning as practical built-in gate resistance trenches.

Step (b) . . . Determine the inter-contact distance Lr of each of K of the practical built-in gate resistance trenches.

Step (c) . . . Form one of the semiconductor devices 101 to 111 so as to satisfy the number K determined in Step (a) above and the inter-contact distance Lr of each of K of the practical built-in gate resistance trenches determined in Step (b) above.

Step (c) is a step of forming any one of the semiconductor devices 101 to 111 so as to satisfy the determination content of Step (a) and Step (b).

Note that the inter-contact distance Lr may be set to the same length between K of the practical built-in gate resistance trenches, or may be set to a different length between at least some of K of the practical built-in gate resistance trenches.

In the method for manufacturing the semiconductor device according to any one of the first to eleventh preferred embodiments, a resistance value of the built-in gate resistance region 5 in any one of the semiconductor devices 101 to lll can be relatively easily adjusted based on the number K of the practical built-in gate resistance trenches and the inter-contact distance Lr by executing the above-described Steps (a) to (c).

Further, Step (c) includes Step (c-1) below.

(c-1) The interlayer insulating film 10 is formed with a film thickness of about 0.1 μm to 0.8 μm on the first main surface of the semiconductor substrate 11 by a CVD method.

Note that, as the CVD film to be the interlayer insulating film 10, at least one of a TEOS oxide film, a BPTEOS oxide film, a PSG film, a BPSG film, aluminum oxide, and hafnium oxide can be considered. The CVD film using these as constituent materials has a stress suppression characteristic as described above.

Since Step (c) of the method for manufacturing a semiconductor device includes Step (c-1), it is possible to suppress a fluctuation in a resistance characteristic of each of the built-in gate resistance units 7 caused by the interlayer insulating film 10 in the first to eleventh preferred embodiments.

Note that, in Step (c-1), a CVD film other than that using the above-described constituent materials may be formed. However, the condition is that the interlayer insulating film 10 to be formed has the above-described stress suppression characteristic.

<Others>

Although the first to eleventh preferred embodiments are described above, the present invention is not limited to the structure of the above-described preferred embodiments, and various developments can be made.

For example, in the above-described preferred embodiments, the n-type is indicated as the first conductivity type, and the p-type is indicated as the second conductivity type. However, the first conductivity type may be the p-type, and the second conductivity type may be the n-type.

Although the IGBT 50 is described as a switching element having an insulated gate structure, a power device such as a MOSFET or an RC-IGBT can be applied other than the IGBT 50. Further, although the trench type IGBT 50 is described in the above-described preferred embodiments, a planar type switching element such as a planar type IGBT may be used.

Further, various substrates such as a semiconductor substrate of a withstand voltage class, an FZ substrate, an MCZ substrate, and an epitaxial substrate can be applied as the semiconductor substrate 11. Note that the FZ substrate is a semiconductor substrate manufactured by a floating zone (FZ) method, the MCZ substrate is a semiconductor substrate manufactured by a magnetic field applied Czochralski (MCZ) method, and the epitaxial substrate is a semiconductor substrate manufactured by an epitaxial growth method.

Note that, in the present disclosure, within the scope of the disclosure, the preferred embodiments can be freely combined with each other, and each of the preferred embodiments can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device including a switching element having an insulated gate structure, the switching element being provided in a semiconductor substrate of a first conductivity type, the semiconductor device comprising:
  a gate wiring that is provided on the semiconductor substrate with an interlayer insulating film interposed therebetween and electrically connected to a gate electrode of the switching element;
  a gate pad that is provided on the semiconductor substrate with the interlayer insulating film interposed therebetween and has an electrical connection region whose surface is exposed; and
  a built-in gate resistance region that electrically connects the gate wiring and the gate pad, wherein
  the built-in gate resistance region includes N (N≥2) partial built-in gate resistance regions connected in parallel between the gate wiring and the gate pad,
  each of the N partial built-in gate resistance regions includes M (M≥2) built-in gate resistance trenches connected in parallel between the gate wiring and the gate pad,
  the gate wiring has a wiring side contact region overlapping the M built-in gate resistance trenches in plan view,
  the gate pad has a pad side contact region overlapping the M built-in gate resistance trenches in plan view,
  each of the M built-in gate resistance trenches is embedded in the semiconductor substrate,
  K (M≥K≥2) of the M built-in gate resistance trenches function as practical built-in gate resistance trenches,
  each of the K practical built-in gate resistance trenches
  is electrically connected to the wiring side contact region of the gate wiring via a wiring contact provided penetrating the interlayer insulating film, and
  is electrically connected to the pad side contact region of the gate pad via a pad contact provided penetrating the interlayer insulating film, and
  in each of the K practical built-in gate resistance trenches, a gate current path is provided between the wiring contact and the pad contact, and a distance between the wiring contact and the pad contact in the gate current path is defined as an inter-contact distance.

2. The semiconductor device according to claim 1, wherein
  the interlayer insulating film includes at least one of a TEOS oxide film, a BPTEOS oxide film, a PSG film, a BPSG film, aluminum oxide, and hafnium oxide.

3. The semiconductor device according to claim 1, wherein
  K≥3 is established, and
  in each of the K practical built-in gate resistance trenches, the inter-contact distance is 100 μm or more.

4. The semiconductor device according to claim 1, wherein

M>K is established, each of the M built-in gate resistance trenches has a rectangular shape in plan view, has a long side in a first direction, and has a short side in a second direction, the M built-in gate resistance trenches include first to M-th built-in gate resistance trenches arranged in order of first, second, . . . , M-th along the second direction, at least one of the M built-in gate resistance trenches is an unused built-in gate resistance trench, and the first built-in gate resistance trench and the M-th built-in gate resistance trench do not correspond to at least one unused built-in gate resistance trench, and the at least one unused built-in gate resistance trench does not have an electrical connection relationship with the gate wiring or the gate pad.

5. The semiconductor device according to claim 1, wherein the wiring side contact region includes a plurality of wiring side contact regions, the pad side contact region includes a plurality of pad side contact regions, the wiring contact includes a plurality of wiring contacts, and the plurality of wiring contacts correspond to the plurality of wiring side contact regions on a one-to-one basis, the pad contact includes a plurality of pad contacts, and the plurality of pad contacts correspond to the plurality of pad side contact regions on a one-to-one basis, the gate current path includes a plurality of partial gate current paths connected in parallel between the gate wiring and the gate pad, and each of the plurality of partial gate current paths is provided between one of the plurality of wiring contacts and one of the plurality of pad contacts.

6. The semiconductor device according to claim 1, wherein the gate pad further includes a pad main region having a rectangular shape in plan view, and the pad main region includes the electrical connection region, N=4 is established, and the N partial built-in gate resistance regions are provided to face four sides of the pad main region in plan view.

7. The semiconductor device according to claim 6, wherein the wiring side contact region and the pad side contact region are both provided along a contact region formation direction, the wiring side contact region and the pad side contact region are arranged to be separated by an inter-pad wiring distance in a facing direction, and the facing direction intersects the contact region formation direction, and each of the K practical built-in gate resistance trenches has a first formation region extending in the contact region formation direction and a second formation region extending in the facing direction.

8. The semiconductor device according to claim 6, wherein the wiring side contact region and the pad side contact region are both provided along a contact region formation direction, the wiring side contact region and the pad side contact region are arranged to be separated by an inter-pad wiring distance in a facing direction, and the facing direction intersects the contact region formation direction, and each of the K practical built-in gate resistance trenches has a parallelogram shape in plan view, in which a direction intersecting each of the contact region formation direction and the facing direction is a long side direction.

9. The semiconductor device according to claim 6, wherein the N partial built-in gate resistance regions are classified into first to fourth partial built-in gate resistance regions, and resistance values of the first to fourth partial built-in gate resistance regions are set to different values.

10. The semiconductor device according to claim 6, wherein the gate wiring has a built-in gate resistance measurement pad having a measurement region whose surface is exposed, and the built-in gate resistance measurement pad functions as the wiring side contact region corresponding to at least one of the N partial built-in gate resistance regions.

11. The semiconductor device according to claim 1, further comprising:

a well layer of a second conductivity type provided in an upper layer portion of the semiconductor substrate, wherein bottom portions of the M built-in gate resistance trenches are present in the well layer.

12. The semiconductor device according to claim 1, further comprising:

a well layer of a second conductivity type provided in an upper layer portion of the semiconductor substrate; and a barrier layer of a second conductivity type selectively provided in the semiconductor substrate, wherein a formation depth of the well layer is shallower than a formation depth of the M built-in gate resistance trenches, and bottom portions of the M built-in gate resistance trenches are present in the barrier layer.

13. The semiconductor device according to claim 1, wherein each of the M built-in gate resistance trenches has a trench electrode and a trench insulating film covering the trench electrode, the trench electrode of each of the M built-in gate resistance trenches has a constant resistance trench depth, a surface of the trench electrode of each of the M built-in gate resistance trenches has a first formation width, a bottom surface of the trench electrode of each of the M built-in gate resistance trenches has a second formation width, and a difference value between the first formation width and the second formation width is set to $\frac{1}{10}$ or less of the first formation width.

14. A method for manufacturing the semiconductor device according to claim 1, the method comprising the steps of:

(a) determining a number K of the M built-in gate resistance trenches that function as practical built-in gate resistance trenches;

(b) determining the inter-contact distance of each of the K practical built-in gate resistance trenches; and (c) forming the semiconductor device so as to satisfy determination content of the Steps (a) and (b).

* * * * *